(12) United States Patent
Hausmann et al.

(10) Patent No.: US 10,460,930 B2
(45) Date of Patent: Oct. 29, 2019

(54) SELECTIVE GROWTH OF SIO2 ON DIELECTRIC SURFACES IN THE PRESENCE OF COPPER

(71) Applicant: Lam Research Corporation, Fremont, CA (US)

(72) Inventors: Dennis M. Hausmann, Lake Oswego, OR (US); Alexander R. Fox, Portland, OR (US); Colleen Lawlor, Clinton, NY (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/821,590

(22) Filed: Nov. 22, 2017

(65) Prior Publication Data

US 2019/0157076 A1 May 23, 2019

(51) Int. Cl.
*H01L 21/02* (2006.01)
*H01L 21/67* (2006.01)
(Continued)

(52) U.S. Cl.
CPC ...... *H01L 21/02233* (2013.01); *C23C 16/401* (2013.01); *C23C 16/45527* (2013.01);
(Continued)

(58) Field of Classification Search
CPC ......... H01L 21/02233; H01L 21/02164; H01L 21/02211; H01L 21/02304; H01L 21/67207
(Continued)

(56) References Cited

U.S. PATENT DOCUMENTS

| 4,539,061 A | 9/1985 | Sagiv |
| 6,423,582 B1 | 7/2002 | Fischer et al. |

(Continued)

FOREIGN PATENT DOCUMENTS

| JP | 2013-079447 A | 5/2013 |
| KR | 10-2017-0016310 A | 2/2017 |
| WO | WO 2016/209570 | 12/2016 |

OTHER PUBLICATIONS

Chabal* et al. (2016) "Atomic Layer Deposition of Silicon Dioxide Using Aminosilanes Di-sec-butylaminosilane and Bis(tert-butylamino)silane with Ozone," *The Journal of Physical Chemistry C*, ACS Publications, American Chemical Society, 120:10927-10935.

(Continued)

*Primary Examiner* — Sheikh Maruf
(74) *Attorney, Agent, or Firm* — Weaver Austin Villeneuve & Sampson LLP

(57) ABSTRACT

Methods and apparatuses for selectively depositing silicon oxide on dielectric surfaces relative to a metal-containing surface such as copper are provided. Methods involve exposing a substrate having dielectric and copper surfaces to a copper-blocking reagent such as an alkyl thiol to selectively adsorb to the copper surface, exposing the substrate to a silicon-containing precursor for depositing silicon oxide, exposing the substrate to a weak oxidant gas and igniting a plasma to convert the adsorb silicon-containing precursor to form silicon oxide, and exposing the substrate to a reducing agent to reduce any oxidized copper from exposure to the weak oxidant gas.

20 Claims, 12 Drawing Sheets

(51) Int. Cl.
  *C23C 16/455* (2006.01)
  *C23C 16/52* (2006.01)
  *C23C 16/40* (2006.01)
  *C23C 16/50* (2006.01)

(52) U.S. Cl.
  CPC ........ *C23C 16/45544* (2013.01); *C23C 16/50* (2013.01); *C23C 16/52* (2013.01); *H01L 21/02164* (2013.01); *H01L 21/02211* (2013.01); *H01L 21/02304* (2013.01); *H01L 21/67207* (2013.01)

(58) Field of Classification Search
  USPC .......................................................... 438/771
  See application file for complete search history.

(56) References Cited

U.S. PATENT DOCUMENTS

| | | | |
|---|---|---|---|
| 6,593,000 | B2 | 7/2003 | Ohtake et al. |
| 7,875,312 | B2 | 1/2011 | Thridandam et al. |
| 8,043,907 | B2 | 10/2011 | Ma et al. |
| 8,530,361 | B2 | 9/2013 | Xiao et al. |
| 8,592,005 | B2 | 11/2013 | Ueda |
| 8,668,957 | B2 | 3/2014 | Dussarrat et al. |
| 8,821,986 | B2 | 9/2014 | Weidman et al. |
| 8,853,075 | B2 | 10/2014 | Gatineau et al. |
| 8,940,648 | B2 | 1/2015 | Xiao et al. |
| 8,945,305 | B2 | 2/2015 | Marsh |
| 9,219,007 | B2 | 12/2015 | Chen et al. |
| 9,257,334 | B2 | 2/2016 | Chen et al. |
| 9,331,094 | B2 | 5/2016 | Hada |
| 9,371,338 | B2 | 6/2016 | Dussarrat et al. |
| 9,911,595 | B1 | 3/2018 | Smith et al. |
| 10,043,656 | B1 | 8/2018 | Smith et al. |
| 10,176,984 | B2 | 1/2019 | Smith et al. |
| 10,199,212 | B2 | 2/2019 | Smith et al. |
| 10,242,866 | B2 | 3/2019 | Smith et al. |
| 2004/0166680 | A1* | 8/2004 | Miyajima ............ H01L 21/3105 438/689 |
| 2004/0259378 | A1* | 12/2004 | Chambers ......... H01L 21/76834 438/771 |
| 2005/0017319 | A1 | 1/2005 | Manabe et al. |
| 2005/0208778 | A1 | 9/2005 | Li et al. |
| 2006/0128142 | A1 | 6/2006 | Whelan et al. |
| 2008/0032064 | A1 | 2/2008 | Gordon et al. |
| 2008/0237861 | A1* | 10/2008 | Dominguez ............ C23C 16/18 257/751 |
| 2008/0242097 | A1 | 10/2008 | Boescke et al. |
| 2011/0178092 | A1 | 7/2011 | Ali et al. |
| 2011/0256721 | A1 | 10/2011 | Gatineau |
| 2012/0205315 | A1 | 8/2012 | Liu et al. |
| 2012/0315740 | A1 | 12/2012 | Yao |
| 2013/0017328 | A1* | 1/2013 | Miyoshi ................ C23C 16/401 427/255.37 |
| 2013/0323435 | A1* | 12/2013 | Xiao ........................ C09D 1/00 427/579 |
| 2014/0113457 | A1 | 4/2014 | Sims et al. |
| 2014/0252486 | A1 | 9/2014 | Lin et al. |
| 2014/0363969 | A1 | 12/2014 | Chen et al. |
| 2015/0004806 | A1* | 1/2015 | Ndiege ............. H01L 21/02164 438/789 |
| 2015/0014823 | A1* | 1/2015 | Mallikarjunan ...... C23C 16/402 257/632 |
| 2015/0087139 | A1* | 3/2015 | O'Neill .................... C23C 16/24 438/482 |
| 2015/0111374 | A1 | 4/2015 | Bao et al. |
| 2015/0147871 | A1* | 5/2015 | Xiao ................. H01L 21/02126 438/482 |
| 2015/0155523 | A1 | 6/2015 | Kamiya |
| 2015/0235835 | A1 | 8/2015 | Swaminathan et al. |
| 2015/0299848 | A1 | 10/2015 | Haukka et al. |
| 2015/0340225 | A1 | 11/2015 | Kim et al. |
| 2015/0364372 | A1 | 12/2015 | Chen et al. |
| 2015/0371896 | A1 | 12/2015 | Chen et al. |
| 2016/0024647 | A1 | 1/2016 | Saly et al. |
| 2016/0056074 | A1 | 2/2016 | Na et al. |
| 2016/0079521 | A1 | 3/2016 | Draeger et al. |
| 2016/0126106 | A1 | 5/2016 | Shimizu et al. |
| 2016/0280724 | A1 | 9/2016 | Arkles et al. |
| 2016/0322213 | A1* | 11/2016 | Thompson .......... H01L 21/0228 |
| 2016/0376152 | A1 | 12/2016 | Toutonghi |
| 2017/0004974 | A1* | 1/2017 | Manna .............. H01L 21/02164 |
| 2017/0029947 | A1 | 2/2017 | Kawahara et al. |
| 2017/0029948 | A1 | 2/2017 | Jongbloed et al. |
| 2017/0148642 | A1 | 5/2017 | Wang et al. |
| 2017/0338109 | A1* | 11/2017 | Lei .......................... C23C 16/36 |
| 2018/0233349 | A1 | 8/2018 | Smith et al. |
| 2018/0261447 | A1 | 9/2018 | Smith et al. |
| 2018/0261448 | A1 | 9/2018 | Smith et al. |
| 2018/0269058 | A1 | 9/2018 | Smith et al. |
| 2018/0308680 | A1 | 10/2018 | Reddy et al. |

OTHER PUBLICATIONS

Chen, Rong and Bent*, Stacey F. (2006) "Chemistry for Positive Pattern Transfer Using Area-Selective Atomic Layer Deposition," *Adv. Mater.*, 18:1086-1090.

Chen et al. (2011) "Ozone-Based Atomic Layer Deposition of Crystalline $V_2O_5$ Films for High Performance Electrochemical Energy Storage," *Chemistry of Materials*, ACS Publications, American Chemical Society, 7pp.

Dangerfield et al. (2016) "Role of Trimethylaluminum (TMA) for Low Temperature $SiN_x$, Deposition: Growth Dependence on Number of TMA Exposures," *ALD Conference 2016*, 14pp.

Han et al. (2012) "On the Mechanisms of $SiO_2$ Thin-Film Growth by the Full Atomic Layer Deposition Process Using Bis(t-butylamino)silane on the Hydroxylated SiO2(001) Surface," *The Journal of Physical Chemistry C*, ACS Publications, American Chemical Society, 116:947-952.

Huang et al. (2017) "Design of efficient mono-aminosilane precursors for atomic layer deposition of $SiO_2$ thin films," *Royal Society of Chemistry Adv. 2017*, 7:22672-22678.

Li et al. (2014) "Low Temperature (LT) Thermal ALD Silicon Dioxide Using Ozone Process," *Arradiance Inc.*, Sudbury, MA USA, 1 page.

Liu et al. (Jun. 26-29, 2011) "High Rate Growth of $SiO_2$ by Thermal ALD Using Tris(di-methylamino)silane and Ozone," ALD 2011, *Cambridge NanoTech Inc.*, Cambridge, MA, USA, 14pp.

Ooba et al. (1998) "Self-Limiting Atomic-layer Selective Deposition of Silicon Nitride by Temperature-Controlled Method," *Extended Abstracts of the 1998 International Conference on Solid State Devices and Materials*, Hiroshima, pp. 22-23.

Putkonen et al. (2014) "Thermal and plasma enhanced atomic layer deposition of $SiO_2$ using commercial silicon precursors," *Thin Solid Films*, 558:93-98.

Sundstrom, (Dec. 2005) "Ozone as the Oxidizing Precursor in Atomic Layer Deposition," *Gas & Chemicals, MKS Instruments, Inc.*, Wilmington, MA, 4pp.

Yokoyama et al. (1998) "Atomic-layer selective deposition of silicon nitride on hydrogen-terminated Si surfaces," *Applied Surface Science*, 130-132, 352-356.

U.S. Office Action, dated Nov. 16, 2017, issued in U.S. Appl. No. 15/432,634.

U.S. Notice of Allowance, dated Oct. 20, 2017, issued in U.S. Appl. No. 15/462,695.

U.S. Notice of Allowance, dated Oct. 23, 2017, issued in U.S. Appl. No. 15/456,301.

U.S. Appl. No. 15/432,634, filed Feb. 14, 2017, Smith et al.
U.S. Appl. No. 15/453,815, filed Mar. 8, 2017, Smith et al.
U.S. Appl. No. 15/456,301, filed Mar. 10, 2017, Smith et al.
U.S. Appl. No. 15/462,695, filed Mar. 17, 2017, Smith et al.
U.S. Appl. No. 15/581,951, filed Apr. 28, 2017, Reddy et al.

U.S. Final Office Action dated May 3, 2018 issued in U.S. Appl. No. 15/432,634.

U.S. Notice of Allowance dated Sep. 6, 2018 issued in U.S. Appl. No. 15/432,634.

(56) References Cited

OTHER PUBLICATIONS

U.S. Office Action, dated Feb. 25, 2019, issued in U.S. Appl. No. 15/878,349.
U.S. Office Action, dated Feb. 8, 2018, issued in U.S. Appl. No. 15/453,815.
U.S. Notice of Allowance, dated Oct. 5, 2018, issued in U.S. Appl. No. 15/453,815.
U.S. Notice of Allowance, dated Feb. 13, 2018, issued in U.S. Appl. No. 15/456,301.
U.S. Notice of Allowance, dated Sep. 25, 2018, issued in U.S. Appl. No. 15/975,554.
U.S. Office Action, dated Nov. 1, 2018, issued in U.S. Appl. No. 15/581,951.
International Search Report and Written Opinion dated Jun. 25, 2018 issued in Application No. PCT/US2018/021823.
U.S. Office Action dated Feb. 26, 2019 issued in U.S. Appl. No. 16/206,915.
U.S. Appl. No. 16/206,915, filed Nov. 30, 2018, Smith et al.
U.S. Appl. No. 16/247,296, filed Jan. 14, 2019, Smith et al.

* cited by examiner

SELECTIVE GROWTH OF SIO2 ON DIELECTRIC SURFACES IN THE PRESENCE OF COPPER

BACKGROUND

Semiconductor device fabrication includes fabrication of microprocessors, logic, and memory devices. Such devices may be fabricated using a variety of techniques, including self-aligned patterning such as double patterning or quad patterning, gapfill processes, and other techniques. Some processes involve formation of structures that include silicon oxide and metal, such as copper. Conventional techniques for forming such structures may be limited.

SUMMARY

Provided herein are methods and apparatus for processing semiconductor substrates. One aspect involves a method of selectively depositing silicon oxide on a dielectric material relative to copper on a substrate, the method including: (a) providing the substrate including the dielectric material and exposed copper metal surface; (b) prior to depositing the silicon oxide, exposing the substrate to a copper-blocking reagent to selectively adsorb onto the exposed copper metal surface; (c) exposing the substrate to a silicon-containing precursor to adsorb the silicon-containing precursor onto the dielectric material; (d) exposing the substrate to an oxidizing plasma generated in an environment comprising a weak oxidant to convert the adsorbed silicon-containing precursors to silicon oxide; and (e) exposing the substrate to a reducing agent to reduce the exposed copper metal surface.

In some embodiments, the copper-blocking reagent includes sulfur.

In some embodiments, the copper-blocking reagent is an alkyl thiol. For example, in some embodiments, the copper-blocking reagent is any one of ethane thiol or butane thiol.

In various embodiments, the copper-blocking reagent is an alkyl thiol having a chemical formula $SH(CH_2)_nCH_3$ whereby n is an integer between and including 2 and 12. In some embodiments, the copper-blocking reagent is an alkyl thiol having a chemical formula $SH(CH_2)_nCH_3$ whereby n is an integer between and including 2 and 6. In some embodiments, the copper-blocking reagent has the chemical formula $SH(CH_2)_2CH_3$. In some embodiments, the copper-blocking reagent has the chemical formula $SH(CH_2)_8CH_3$. In some embodiments, the copper-blocking reagent has the chemical formula $SH(CH_2)_{12}CH_3$.

In some embodiments, the silicon-containing precursor is an aminosilane. For example, the silicon-containing precursor may be any one of N-(diethylaminosilyl)-N-ethylethanamine, bis(diethylamino)silane (BDEAS), diisopropylamino silane (DiPAS), diisobutylamino silane (DiBAS), bis(tert-butylamino)silane (BTBAS), and tris(dimethylamino)silane (TDMAS).

In some embodiments, the weak oxidant is any one of carbon dioxide, nitrous oxide, ozone, plasmas thereof, and water. In some embodiments, the reducing agent is any one of hydrogen gas, hydrogen plasma, hydrazine gas, hydrazine plasma, ammonia gas, ammonia plasma, alcohols, and aldehydes. In some embodiments, the dielectric material is any one of silicon dioxide, aluminum oxide, silicon oxycarbides, silicon carbonitrides, and silicon oxycarbonitrides.

In various embodiments, the silicon oxide is deposited at a temperature between about 70° C. and about 200° C.

The method may also include prior to exposing the substrate to the copper-blocking reagent, introducing a second reducing agent to reduce the exposed copper metal surface. The second reducing agent may be any one of hydrogen gas, hydrogen plasma, hydrazine gas, hydrazine plasma, ammonia gas, ammonia plasma, alcohols, and aldehydes.

The method may also include repeating operations (b)-(e) in two or more cycles. In some embodiments, (c) is self-limiting. In various embodiments, the copper-blocking reagent preferentially adsorbs to the exposed copper metal surface to block subsequent deposition of the silicon oxide on the exposed copper metal surface.

Another aspect involves a method of selectively depositing silicon oxide on a dielectric material relative to a metal-containing surface on a substrate, the method including: (a) providing the substrate including the dielectric material and exposed metal-containing surface; (b) prior to depositing the silicon oxide, exposing the substrate to a metal-blocking reagent to selectively adsorb onto the exposed metal-containing surface; (c) exposing the substrate to a silicon-containing precursor to adsorb the silicon-containing precursor onto the dielectric material; (d) exposing the substrate to an oxidizing plasma generated in an environment comprising a weak oxidant to convert the adsorbed silicon-containing precursors to silicon oxide; and (e) exposing the substrate to a reducing agent to reduce the exposed metal-containing surface.

In various embodiments, the exposed metal-containing surface includes copper. In some embodiments, the exposed metal-containing surface includes ruthenium.

In some embodiments, the exposed metal-containing surface includes any one of copper metal, copper oxide, ruthenium metal, and ruthenium oxide.

In some embodiments, the metal-blocking reagent is an alkyl thiol. For example, in some embodiments, the metal-blocking reagent is any one of ethane thiol or butane thiol.

In various embodiments, the metal-blocking reagent is an alkyl thiol having the chemical formula $SH(CH_2)_nCH_3$ whereby n is an integer between and including 2 and 12.

In some embodiments, the silicon-containing precursor is an aminosilane. For example, the silicon-containing precursor may be any one of N-(diethylaminosilyl)-N-ethylethanamine, bis(diethylamino)silane (BDEAS), diisopropylamino silane (DiPAS), diisobutylamino silane (DiBAS), bis(tert-butylamino)silane (BTBAS), and tris(dimethylamino)silane (TDMAS).

In some embodiments, the weak oxidant is any one of carbon dioxide, nitrous oxide, ozone, plasmas thereof, and water. In some embodiments, the reducing agent is any one of hydrogen gas, hydrogen plasma, hydrazine gas, hydrazine plasma, ammonia gas, ammonia plasma, alcohols, and aldehydes. In some embodiments, the dielectric material is any one of silicon dioxide, aluminum oxide, silicon oxycarbides, silicon carbonitrides, and silicon oxycarbonitrides.

In various embodiments, the silicon oxide is deposited at a temperature between about 70° C. and about 200° C.

The method may also include prior to exposing the substrate to the metal-blocking reagent, introducing a second reducing agent to reduce the exposed metal-containing surface. The second reducing agent may be any one of hydrogen gas, hydrogen plasma, hydrazine gas, hydrazine plasma, ammonia gas, ammonia plasma, alcohols, and aldehydes.

The method may also include repeating operations (b)-(e) in two or more cycles. In some embodiments, (c) is self-limiting. In various embodiments, the metal-blocking reagent preferentially adsorbs to the exposed metal-containing surface to block subsequent deposition of the silicon oxide on the exposed metal-containing surface.

Another aspect involves an apparatus for processing semiconductor substrates, the apparatus including: at least one process chamber comprising a pedestal for holding a semiconductor substrate; at least one outlet for coupling to a vacuum; a plasma generator; one or more process gas inlets coupled to one or more gas sources; and a controller for controlling operations in the apparatus, including machine-readable instructions for: prior to causing deposition of silicon oxide, causing exposure of the semiconductor substrate to a copper-blocking reagent to selectively adsorb onto an exposed copper metal surface; causing exposure of the substrate to a silicon-containing precursor to adsorb the silicon-containing precursor onto a dielectric material on the semiconductor substrate; causing exposure of the substrate to an oxidizing plasma generated in an environment comprising a weak oxidant to convert the adsorbed silicon-containing precursors to deposit silicon oxide; and causing exposure of the substrate to a reducing agent to reduce the exposed copper metal surface.

Another aspect involves an apparatus for processing semiconductor substrates, the apparatus including: at least one process chamber comprising a pedestal for holding a semiconductor substrate; at least one outlet for coupling to a vacuum; a plasma generator; one or more process gas inlets coupled to one or more gas sources; and a controller for controlling operations in the apparatus, including machine-readable instructions for: prior to causing deposition of silicon oxide, causing exposure of the semiconductor substrate to a metal-blocking reagent to selectively adsorb onto an exposed metal-containing surface; causing exposure of the substrate to a silicon-containing precursor to adsorb the silicon-containing precursor onto the dielectric material; causing exposure of the substrate to an oxidizing plasma generated in an environment comprising a weak oxidant to convert the adsorbed silicon-containing precursors to deposit silicon oxide; and causing exposure of the substrate to a reducing agent to reduce the exposed metal-containing surface.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor manufacturing processes often involve deposition and etching of various materials in a patterning scheme to form specific types of semiconductor devices. For example, patterning schemes may be used to fabricate a static random access memory (SRAM) cell. As devices shrink, however, the tolerance of a process for error becomes increasingly small, particularly for fabrication of metal interconnect between a metal trench above and below the metal interconnect. Further, while multiple patterning and/or extreme ultraviolet lithography techniques may be used to fabricate small devices having a low critical dimension, such techniques are not yet capable of fabricating dense circuitry from the 10 nm technology node down to the 5-7 nm technology node. Thus, as a result, in conventional techniques, when one layer is misaligned with a preceding layer, the difference in alignment of a few nanometers becomes a challenge.

One example is provided in FIGS. 1A-1E. These figures depict a conventional process for forming a via over an interconnect, which results in what is referred to as an "unlanded via," whereby material deposited in the via does not align with the preceding interconnect layer due to misalignment in the formation of the mask prior to depositing the metal in the via.

Figure 1A:
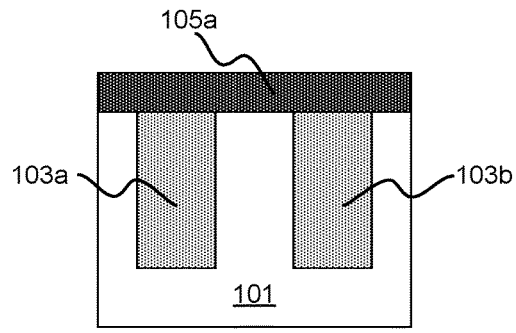
FIGS. 1A-1E are schematic illustrations of a substrate undergoing a process to deposit metal in a via.
Figure 1B:
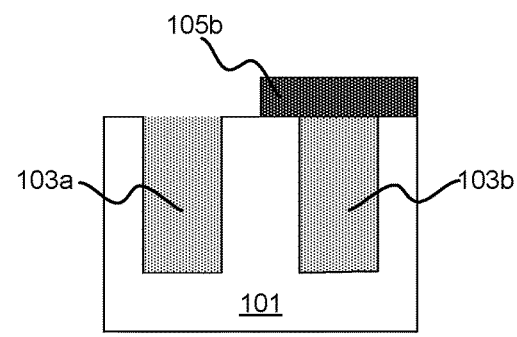
Figure 1C:
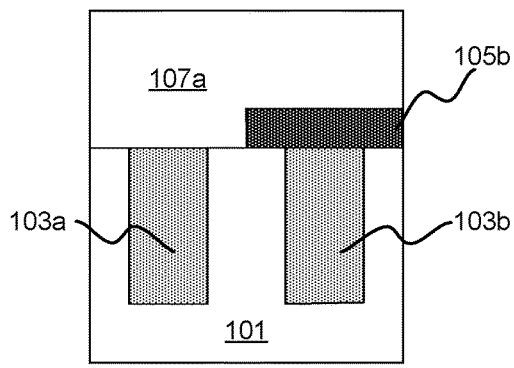
Figure 1D:
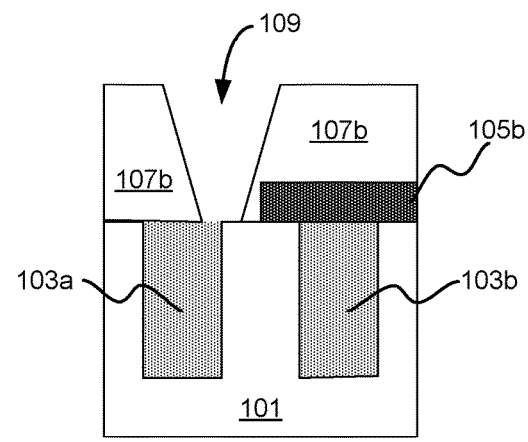

FIG. 1A shows a substrate 101 with metal lines 103a and 103b and an etch stop layer 105a deposited over the substrate 101 with metal lines 103a and 103b. The etch stop layer 105a may be a silicon nitride layer. In FIG. 1B, the etch stop layer 105a of FIG. 1A is patterned to form a patterned etch stop layer 105b. This etching process exposes the surface of metal line 103a but continues to mask metal line 103b. In FIG. 1C, a dielectric material 107a such as silicon oxide is deposited over the substrate 101 with metal line 103a and the patterned etch stop layer 105b. In FIG. 1D, the dielectric material 107a of FIG. 1C is etched using conventional techniques to form an etched dielectric layer 107b including a via 109. To form via 109, conventional techniques involved forming a mask over the substrate, patterning the mask using etching techniques such as lithography techniques, and etching the dielectric material to the pattern of the mask. However, since wafer transfer and alignment processes and etching processes may not always align the mask accurately over the metal line 103a, the via 109 may be misaligned to the metal line 103a, as shown in FIG. 1D. In larger critical dimension features and for fabrication of larger devices, this misalignment may not be a concern, but where the distance between two metal lines 103a and 103b is on a nanometer scale, misalignment of via 109 can cause the via 109 to be aligned too close to an adjacent metal line 103b, which can cause a short or other device problems. Further, it is difficult to obtain a vertical profile in the via 109 using conventional processes.

Figure 1E:
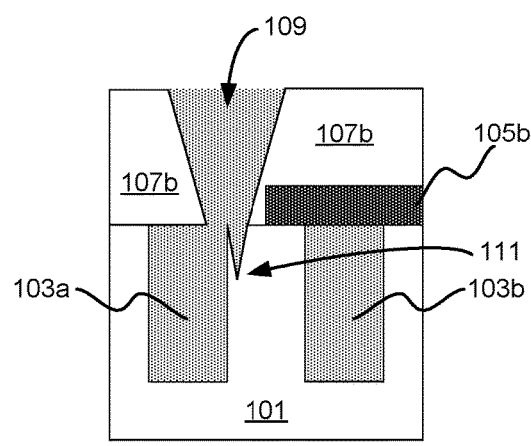

In FIG. 1E, the via 109 is filled with metal to connect to the metal line 103a. However, as a result of the misalignment of via 109, deposition of the metal into the via 109 may penetrate into the substrate material 101, causing the formation of what is referred to as a "fang" or "tiger tooth" defect 111. This overlay deposition at fang 111 may cause device issues. For example, such misalignment cause via to metal shorts, which results in high resistance and poor time-dependent dielectric breakdown (TDDB) lifetime.

Figure 2A:
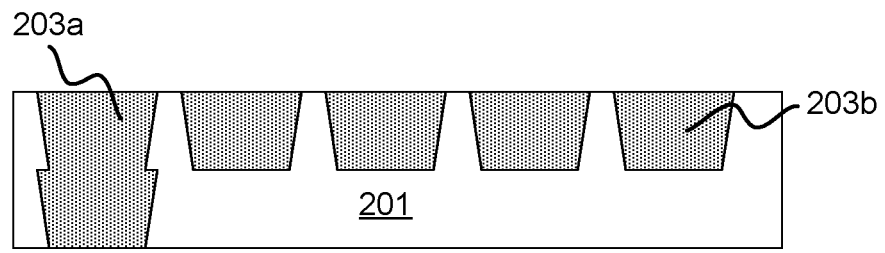
FIGS. 2A-2F are schematic illustrations of a substrate undergoing a process for forming fully aligned vias using selective deposition of dielectric on dielectric.
Figure 2B:
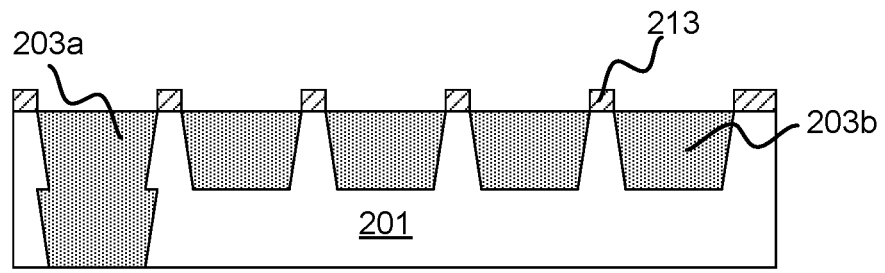
Figure 2C:
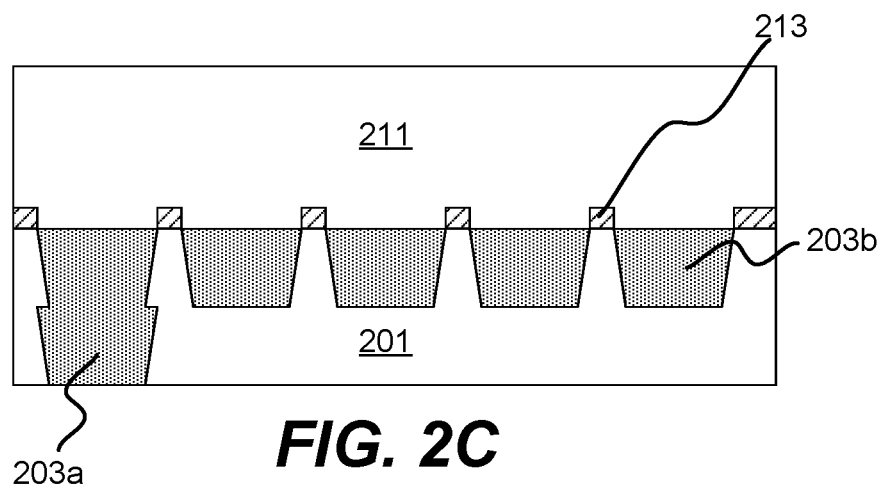
Figure 2D:
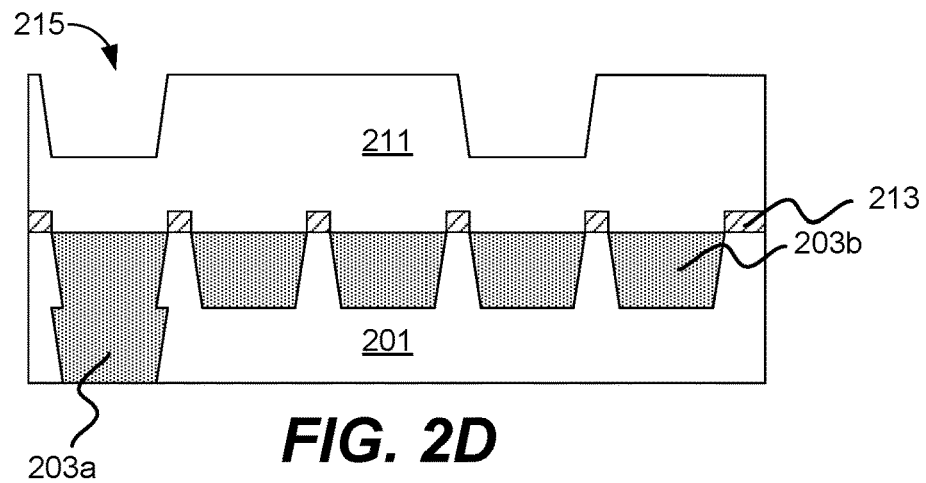
Figure 2E:
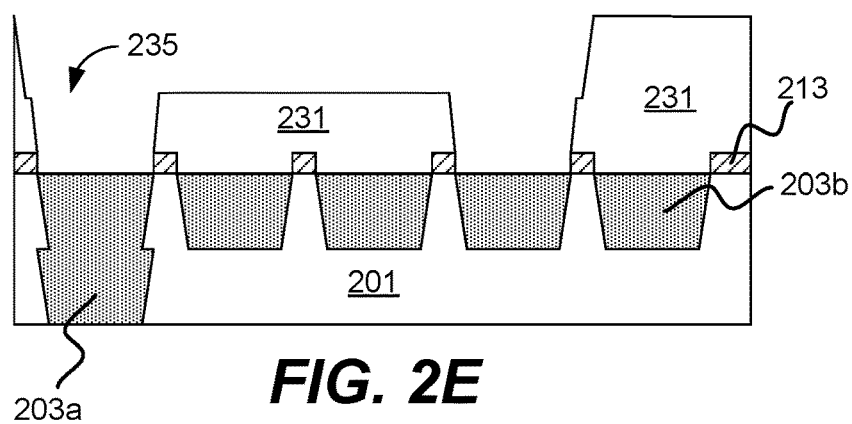
Figure 2F:
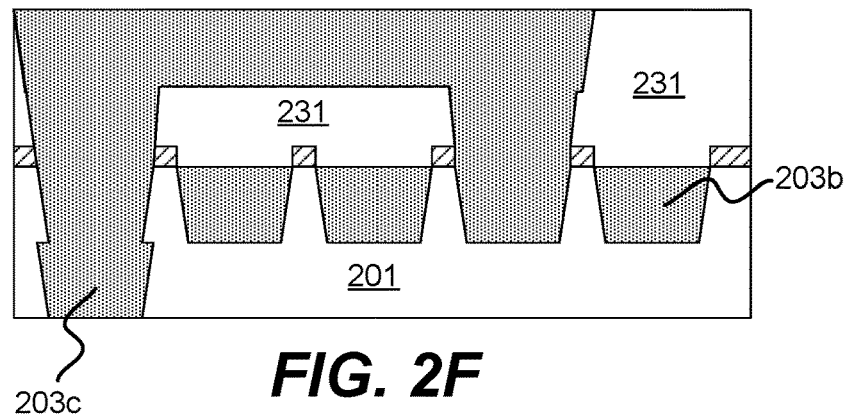

It is desirable to form fully aligned vias. One example is provided in FIGS. 2A-2F. In FIG. 2A, a dielectric substrate 201 includes copper vias 203a and 203b. In FIG. 2B, a dielectric material 213 is deposited selectively on the dielectric 201 surfaces relative to the exposed copper surfaces of copper vias 203a and 203b. Such dielectric material 213 may have etch contrast to ultra low-k (ULK) dielectric. In FIG. 2C, blanket ULK dielectric material 211 is deposited over the substrate that includes the dielectric material 213, and copper vias 203a and 203b. In FIG. 2D, the blanket ULK dielectric material 211 is etched to form vias 215. In FIG. 2E, the blanket ULK dielectric material is further etched to form etched ULK dielectric material 231. Since the selectively deposited dielectric material 213 has etch selectivity to the ULK dielectric material 231, the vias 235 are fully self-aligned. In FIG. 2F, copper is filled into the vias to form the dual damascene structure.

For example, one possible patterning scheme could involve a dual damascene structure planarized by CMP to expose the metal in the via, followed by selective deposition of dielectric material on dielectric material relative to metal in the via, where the dielectric has etch contrast to ultra low-k (ULK) dielectric, followed by blanket ULK dielectric material over the substrate, followed by via etch, and line trench etch whereby etch contrast provides self-alignment, followed by dual damascene metal fill.

However, conventional techniques for depositing silicon oxide selectively on dielectric material relative to copper material are limited. For example, while silicon oxide could be deposited using a chlorine-containing precursor by a thermal reaction, chlorine will likely etch the copper surface as well. Additionally, if a plasma-based reaction is performed using plasma generated using oxygen ($O_2$) gas, the strong oxidizing plasma of oxygen will oxidize the exposed copper surface. Thus, there is a need for selective deposition techniques of dielectric on dielectric material relative to copper to achieve fabrication of the fully aligned via. While techniques exist for depositing metal oxides, such as aluminum oxide, hafnium oxide, and zirconium oxide, using water as a reactant, these techniques may be selective to dielectrics having a high dielectric constant. However, such techniques are not suitable for selectively depositing silicon oxide.

Provided herein are methods of selectively depositing dielectric material on dielectric material relative to copper, copper oxides, ruthenium, and/or ruthenium oxides. For example, disclosed embodiments may involve depositing silicon oxide (e.g., $SiO_2$) on silicon oxide ($SiO_2$), aluminum oxide ($Al_2O_3$), silicon oxycarbides, silicon carbonitrides, and silicon oxycarbonitrides. A non-limiting example of a silicon oxycarbide is a silicon oxycarbide having the chemical formula $SiO_xC_y$ where $2x+4y=4$ (x and y need not be integers). A non-limiting example of a silicon carbonitride is a silicon carbonitride having the chemical formula $SiC_aN_b$ where $4a+3b=4$ (x and y need not be integers). A non-limiting example of a silicon oxycarbonitride is a silicon oxycarbonitride having the chemical formula $SiO_iC_jN_k$ where $2i+4j+3k=4$.

Certain disclosed embodiments involve utilizing the reactivity difference between that of hydroxyl-terminated silicon oxide and of reduced copper to allow selective deposition using exposure to a copper-blocking reagent, such as a thiol, which preferentially adsorbs to the reduced copper surface and blocks subsequent deposition on the copper surface. Certain disclosed embodiments may be particularly suitable for selectively depositing dielectric on dielectric relative to copper surfaces to form fully aligned vias in a patterning scheme such as described above with respect to FIGS. 2A-2F.

Techniques described herein involve thermal atomic layer deposition (ALD) and/or plasma-enhanced atomic layer deposition (PEALD). That is, in various embodiments, the reaction between a silicon-containing precursor and an oxidizing agent to form silicon oxide is performed.

ALD is a technique that deposits thin layers of material using sequential self-limiting reactions. Typically, an ALD cycle includes operations to deliver and adsorb at least one reactant to the substrate surface, and then react the adsorbed reactant with one or more reactants to form the partial layer of film. As an example, a silicon oxide deposition cycle may include the following operations: (i) delivery/adsorption of a silicon-containing precursor, (ii) purging of the silicon precursor from the chamber, (iii) delivery of an oxygen-containing reactant or oxygen-containing gas, and (iv) purging of the oxygen-containing reactant from the chamber.

Unlike a chemical vapor deposition (CVD) technique, ALD processes use surface-mediated deposition reactions to deposit films on a layer-by-layer basis. In one example of an ALD process, a substrate surface that includes a population of surface active sites is exposed to a gas phase distribution of a first precursor, such as a silicon-containing precursor, in a dose provided to a chamber housing a substrate. Molecules of this first precursor are adsorbed onto the substrate surface, including chemisorbed species and/or physisorbed molecules of the first precursor. It should be understood that when the compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the chamber is then evacuated to remove most or all of first precursor remaining in gas phase so that mostly or only the adsorbed species remain. In some implementations, the chamber may not be fully evacuated. For example, the chamber may be evacuated such that the partial pressure of the first precursor in gas phase is sufficiently low to mitigate a reaction. A second reactant, such as an oxygen-containing reactant, is introduced to the chamber so that some of these molecules react with the first precursor adsorbed on the surface. In some processes, the second reactant reacts immediately with the adsorbed first precursor. The chamber may then be evacuated again to remove unbound second reactant molecules. As described above, in some embodiments the chamber may not be completely evacuated. Additional ALD cycles may be used to build film thickness.

In certain embodiments, an ALD first precursor dose partially saturates the substrate surface. In some embodiments, the dose phase of an ALD cycle concludes before the precursor contacts the substrate to evenly saturate the surface. Typically, the precursor flow is turned off or diverted at this point, and only purge gas flows. By operating in this sub-saturation regime, the ALD process reduces the cycle time and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587 (now U.S. Pat. No. 9,355,839), filed Oct. 23, 2013, titled "SUB-SATURATED ATOMIC LAYER DEPOSITION AND CONFORMAL FILM DEPOSITION," which is incorporated herein by reference in its entirety.

As described, in some implementations, the ALD methods include plasma activation. As described herein, the ALD methods and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in their entireties.

Figure 3:
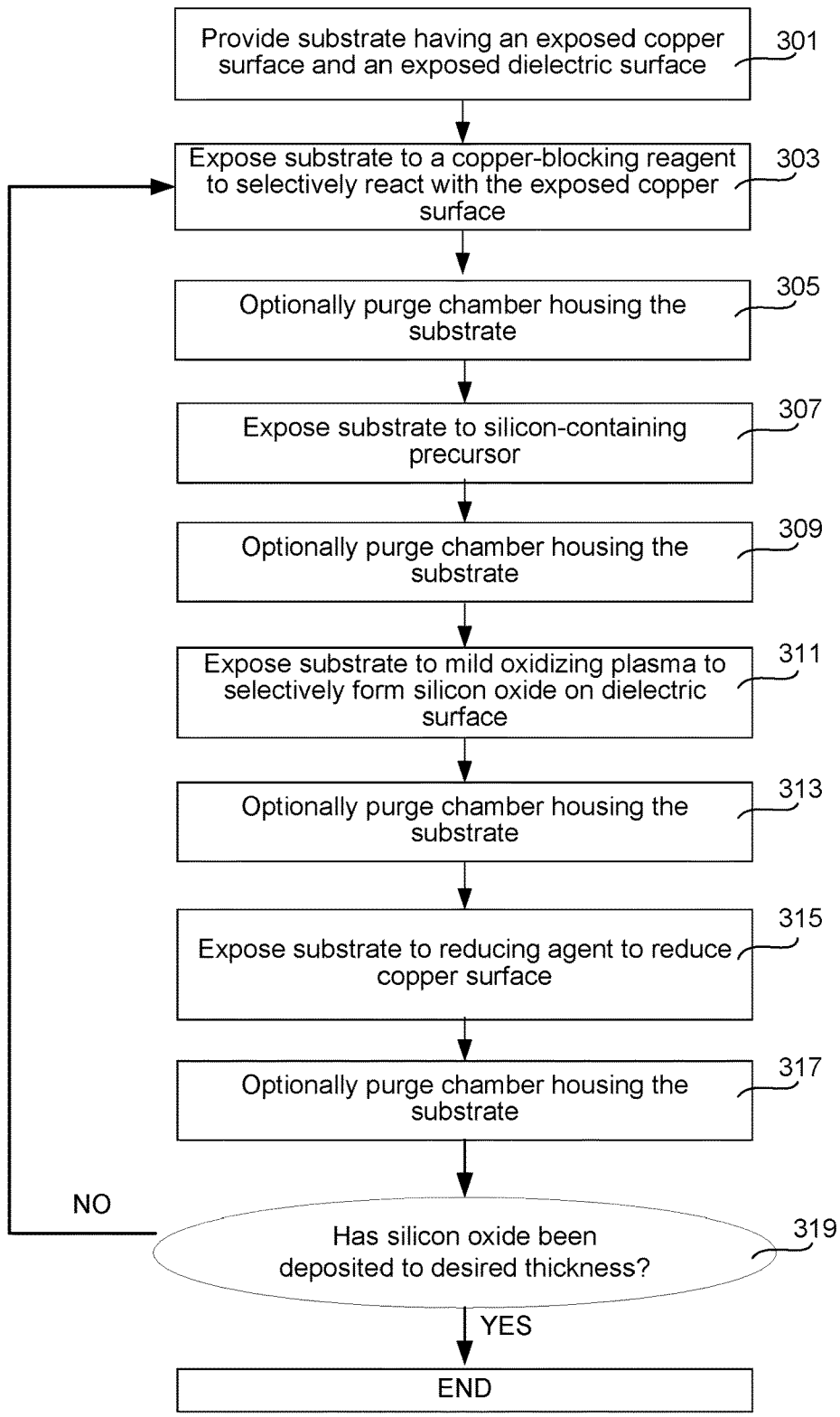
FIG. 3 is a process flow diagram depicting operations for performing a method in accordance with certain disclosed embodiments.

FIG. 3 provides a process flow diagram depicting operations in a method performed in accordance with certain disclosed embodiments. Embodiments described herein may be performed at temperatures between about 70° C. and about 200° C., such as between about 100° C. and about 150° C. In operation 301, a substrate having an exposed copper surface and an exposed dielectric surface is provided. The substrate may be a silicon wafer, e.g., a 200-mm wafer, a 300-mm wafer, or a 450-mm wafer, including wafers having one or more layers of material, such as dielectric, conducting, or semi-conducting material deposited thereon. Non-limiting examples of under-layers include dielectric layers and conducting layers, e.g., silicon oxides, silicon nitrides, silicon carbides, metal oxides, metal nitrides, metal carbides, and metal layers.

In various embodiments, the substrate includes a dielectric material and vias filled with a metal (such as interconnect lines). In various embodiments, the dielectric material may be a silicon-containing material, such as silicon oxide. In various embodiments, the dielectric material may be an ULK dielectric. In some embodiments, the dielectric material may be a semiconductor material instead of a dielectric material. In various embodiments, the dielectric layer includes hydroxyl-terminated silicon oxide.

In various embodiments, the vias are filled with copper. In some embodiments, the vias are filled with copper oxides, ruthenium, and/or ruthenium oxides. In some embodiments, the copper is reduced using exposure to a reducing agent such as hydrogen or hydrazine to prepare the service for subsequent operations.

Figure 4A:
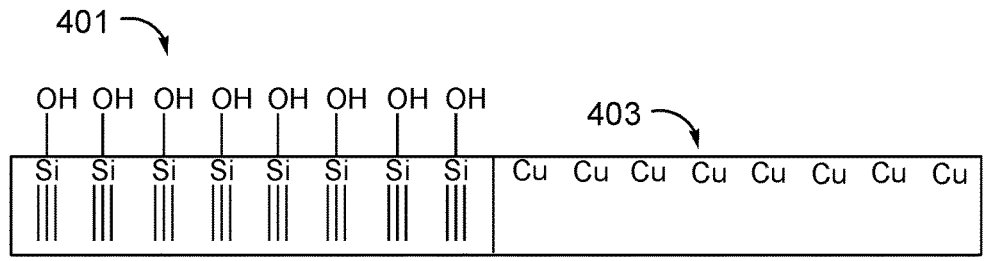
FIGS. 4A-4E are schematic diagrams of an example of a mechanism for selectively depositing dielectric material in accordance with certain disclosed embodiments.

FIG. 4A is a schematic illustration of an example substrate having an exposed silicon oxide surface 401 and an exposed copper surface 403.

In operation 303, the substrate is exposed to a copper-blocking reagent to selectively react with the exposed copper surface. In various embodiments, the copper-blocking reagent is a thiol. In some embodiments, the copper-blocking reagent is an alkyl thiol having the structure:

where n is an integer between and including 2 and 12, or between and including 2 and 6. For example, in some embodiments, n may be 8. In some embodiments, n may be 12. Example thiols include alkyl thiols such as ethane thiol and butane thiol such as depicted below:

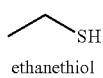
ethanethiol

butanethiol

The copper-blocking reagent is selected to be reactive with copper and copper oxide surfaces but not reactive with dielectric surfaces such as hydroxyl-terminated silicon oxide surfaces. For example, thiols include a sulfur atom which may react with copper on the copper surface where the copper was previously reduced by a reducing agent. Since some copper surfaces have native oxides on the surface forming copper oxide, thiols selected include sulfur atoms that react with copper oxide to form water and a thiolate.

The blocked copper surface is both non-volatile and sterically crowded. In some embodiments, a methane thiol is not used since it may not be sufficiently bulky to prevent oxidation of the copper surface. In some embodiments, octane thiols may not be used as they include a long tail to be sufficiently bulky to prevent oxidation of the copper surface but cannot be packed tightly to adsorb to most of the exposed copper surface. In various embodiments, the alkyl chain is a carbon chain with only hydrogen atoms and no other non-hydrogen substituents.

Figure 4B:
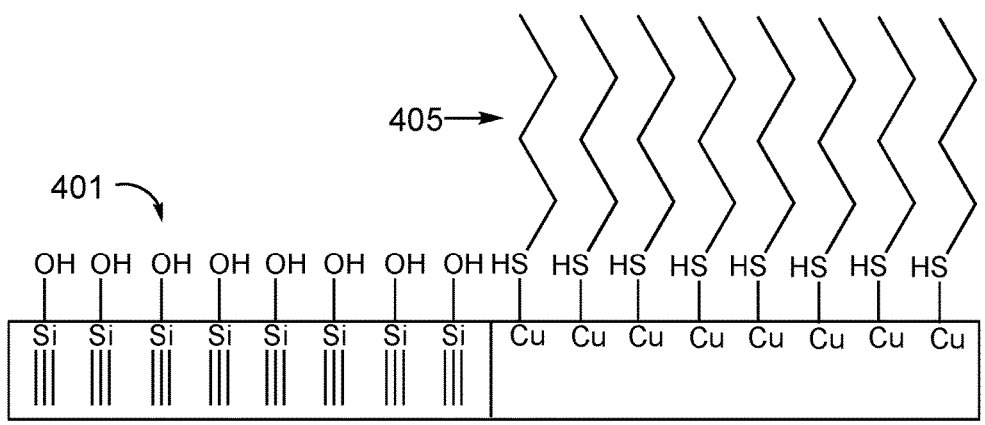

FIG. 4B is a schematic illustration of an example substrate having an exposed silicon oxide surface 401 that did not react with a butane thiol as the copper-blocking reagent, whereas the exposed copper surface 403 of FIG. 4A reacted with the butane thiol to form blocked surface 405.

Returning to FIG. 3, in operation 305, a chamber housing the substrate may be optionally purged to remove excess copper-blocking reagent that does not react with the exposed copper surfaces. Purging the chamber may involve flowing a purge gas or a sweep gas, which may be a carrier gas used in other operations or may be a different gas. In some embodiments, purging may involve evacuating the chamber. Example purge gases include argon, nitrogen, hydrogen, and helium. In some embodiments, operation 305 may include one or more evacuation subphases for evacuating the process chamber. Alternatively, it will be appreciated that operation 305 may be omitted in some embodiments. Operation 305 may have any suitable duration, such as between about 0 seconds and about 60 seconds, for example about 0.01 seconds. In some embodiments, increasing a flow rate of one or more purge gases may decrease the duration of operation 305. For example, a purge gas flow rate may be adjusted according to various reactant thermodynamic characteristics and/or geometric characteristics of the process chamber and/or process chamber plumbing for modifying the duration of operation 305. In one non-limiting example, the duration of a purge phase may be adjusted by modulating purge gas flow rate. This may reduce deposition cycle time, which may improve substrate throughput. After a purge, the copper-blocking reagent remains adsorbed onto the copper surface.

In operation 307, the substrate is exposed to a silicon-containing precursor. In various embodiments, the silicon-containing precursor is an aminosilane. An aminosilane includes at least one nitrogen atom bonded to a silicon atom, but may also contain hydrogens, oxygens, halogens, and carbons. Examples of aminosilanes are mono-, di-, tri- and tetra-aminosilane ($H_3Si(NH_2)$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiary-butylamino)silane ($SiH_2(NHC(CH_3)_3)_2$ (BTBAS), tert-butyl silylcarbamate, $SiH(CH_3)—(N(CH_3)_2)_2$, $SiHCl—(N(CH_3)_2)_2$, $(Si(CH_3)_2NH)_3$ and the like. A further example of an aminosilane is trisilylamine ($N(SiH_3)$).

In some embodiments, the silicon-containing precursor is an alkylaminosilane having the general structure:

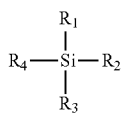

where at least one of R1, R2, R3, and R4 include a primary or secondary amino group. In some embodiments, 1 to 3 of the substituents R1, R2, R3, and R4 is a hydrogen atom. For example, in some embodiments, the silicon-containing precursor is SAM24 (N-(diethylaminosilyl)-N-ethylethanamine) having the structure:

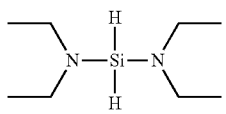

Figure 4C:
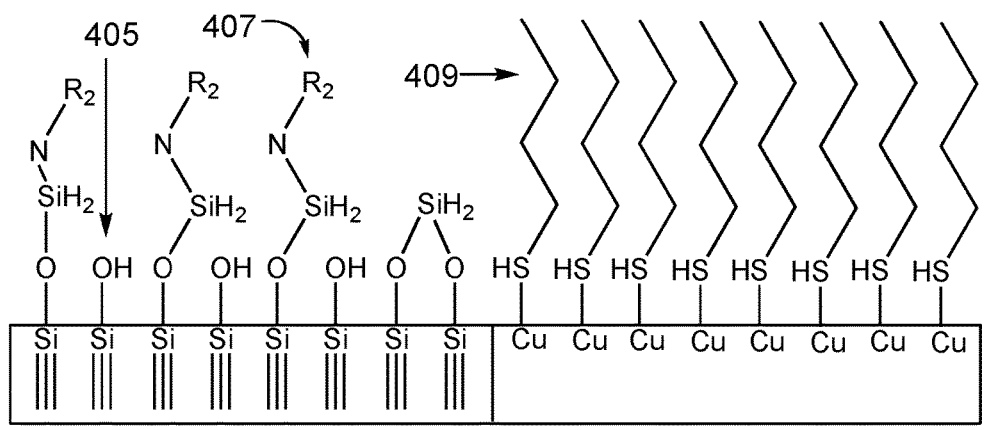

The silicon-containing precursor is an aminosilane. Example silicon-containing precursors include bis(diethylamino)silane (BDEAS), diisopropylamino silane (DiPAS), diisobutylamino silane (DiBAS), bis(tert-butylamino)silane (BTBAS), and tris(dimethylamino)silane (TDMAS). The silicon-containing precursor forms a silicon amide on the surface of the substrate, as depicted in FIG. 4C at amide 407. In some embodiments, some hydroxyl-terminated groups 405 may remain on the surface during operation 307. Note that given the blocked copper surface 409, the silicon-containing precursor does not adsorb onto the copper surface.

Operation 307 may be part of an atomic layer deposition (ALD) cycle. As discussed above, generally an ALD cycle is the minimum set of operations used to perform a surface deposition reaction one time. In some embodiments, the result of one cycle is production of at least a partial silicon oxide film layer on a substrate surface. The cycle may include certain ancillary operations such as sweeping one of the reactants or byproducts and/or treating the partial film as deposited. Generally, a cycle contains one instance of a unique sequence of operations. As discussed above, generally a cycle is the minimum set of operations used to perform a surface deposition reaction one time. The result of one cycle is production of at least a partial film layer, e.g., a partial silicon nitride film layer, on a substrate surface.

During operation 307, the substrate is exposed to a silicon-containing precursor such that the silicon-containing precursor is adsorbed onto the substrate surface to form an adsorbed layer. In some embodiments, aminosilane precursor adsorbs onto the substrate surface in a self-limiting manner such that once active sites are occupied by the aminosilane precursor, little or no additional aminosilane precursor will be adsorbed on the substrate surface. For example, amino-silane precursor may be adsorbed onto about 60% of the substrate surface. In various embodiments, when the aminosilane precursor is flowed to the chamber, the aminosilane precursor adsorbs onto active sites on the surface of the substrate, forming a thin layer of the aminosilane precursor on the surface. In various embodiments, this layer may be less than a monolayer, and may have a thickness between about 0.2 Å and about 0.4 Å. Methods provided herein may be performed at a temperature about 70° C. and about 200° C., such as between about 100° C. and about 150° C.

Returning to FIG. 3, in operation 309, the chamber housing the substrate may be optionally purged using any one or more techniques as described above with respect to operation 305.

Figure 4D:
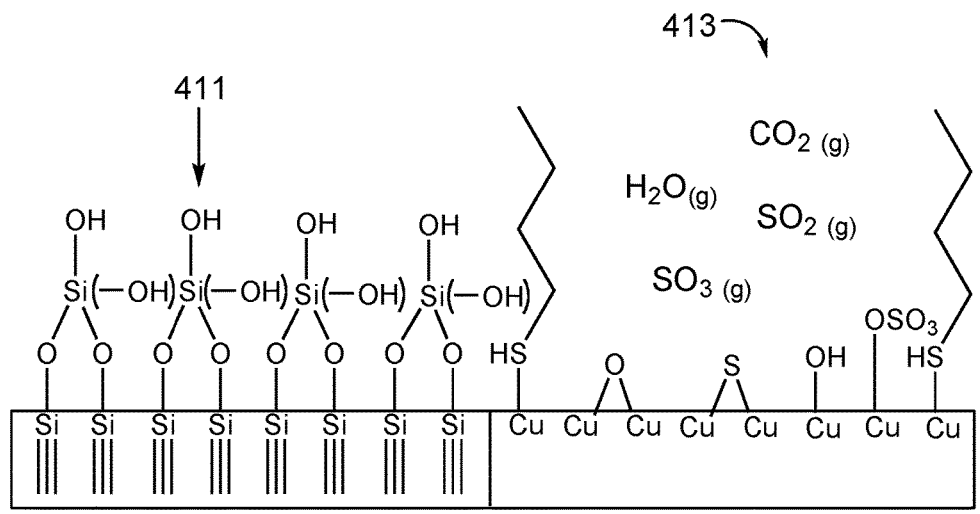

In operation 311, the substrate is exposed to a mild oxidizing plasma. A mild oxidizing plasma is generated using a weak oxidant, which is defined as an oxidant that limits oxidation of bulk copper to a depth of less than 10 Å of surface oxidation. Example mild oxidants include carbon dioxide, nitrous oxide, ozone, and water. Any one or more of these oxidants may be used to generate a plasma except water. In some embodiments, water vapor is used instead of an oxidizing plasma. A mild oxidizing plasma is used to prevent oxidation on the copper surface. Thus, the oxidant may be selected such that it is not reactive with copper but is reactive with the adsorbed silicon-containing precursors on the dielectric surface. FIG. 4D shows an example of a substrate after exposure to a carbon dioxide plasma such that hydroxyl-terminated silicon groups 411 remain on the surface, thereby building thickness of the silicon oxide. During oxidation the blocking reagents may react with the oxide to form a variety of gases 413, such as water, carbon dioxide, sulfur dioxide, sulfur trioxide. Such gases are mild oxidants and therefore may not necessarily oxidize the copper surface. However, as shown in FIG. 4D, some copper may be oxidized or may form a hydroxyl-terminated copper surface. In some embodiments, some copper-blocking reagents may remain on the surface.

Returning to FIG. 3, in operation 313, the chamber housing the substrate is optionally purged to remove excess byproducts, such as gases formed from reacting the mild oxidizing plasma with the blocking reagents and from reacting the mild oxidizing plasma with the silicon-containing precursor adsorbed onto the surface of the substrate. purging may be performed using any one or more of the techniques as described above with respect to operation 305.

In operation 315, the substrate is exposed to a reducing agent to reduce the copper surface. The reducing agent may be hydrogen gas, hydrogen plasma, hydrazine gas, hydrazine plasma, ammonia gas, ammonia plasma, alcohol in gas form, or an aldehyde in gas form. Example alcohols include ethanol and iso-propanol. One example aldehyde that may be used is formaldehyde. In some embodiments, a plasma is used instead of a gas to improve reduction efficiency. In some embodiments, a plasma is ignited during operation 315 to form a plasma generated based on one of hydrogen, hydrazine, or ammonia. For example, in some embodiments, operation 315 involves exposing the substrate to a hydrogen plasma to reduce the copper surface. The reducing agent allows the copper surface to reduce the amount of oxidation of the copper surface, such that subsequent deposition of dielectric material can be deposited selectively on the dielectric surface without depositing on the copper surface. The reducing agent is selected such that the deposited silicon oxide material is not affected by the reducing agent.

In some embodiments, operation 315 is performed prior to performing operation 303. In some embodiments, operation 315 is performed both before performing operation 303 and after performing operation 311. In various embodiments, the reducing agent used before and after are different. In some embodiments, the reducing agents are the same.

Figure 4E:
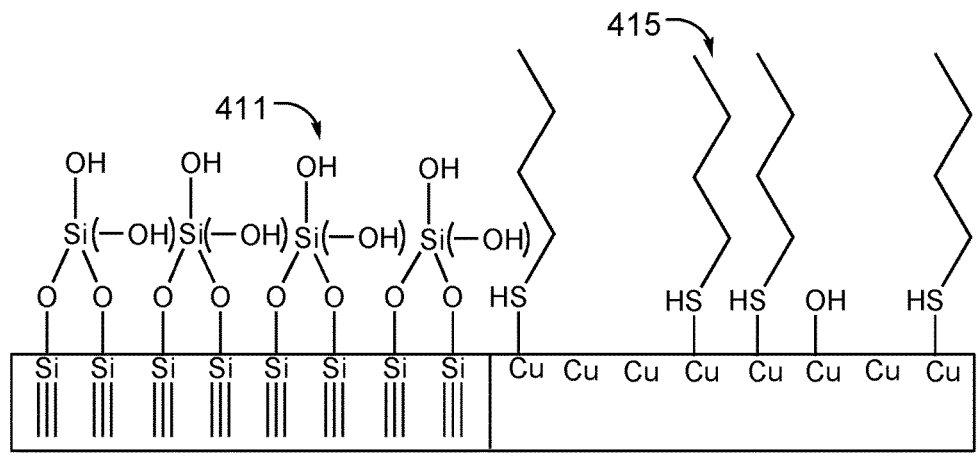

FIG. 4E shows an example substrate whereby, after exposure to the reducing agent, silicon oxide 411 remains on the surface, and some thiols 415 are replenished on the surface, and some oxidized copper from FIG. 4D is reduced to leave a copper surface.

Returning to FIG. 3, in operation 317, the chamber is optionally purged to remove excess byproducts from exposing the substrate to the reducing agent in operation 315. In various embodiments, these byproducts include products from reacting the reducing agent with oxidized copper to form, for example, water.

In operation 319, it is determined whether the silicon oxide is deposited to a desired thickness. If so, the deposition process ends. If not, the deposition may resume by repeating operations 303-317 in cycles. In various embodiments, operations 303 and 315 are performed in every cycle. In some embodiments, either of or both of operations 303 and 315 are performed every other cycle. However, it may be suitable to perform both operation 303 and 315 every cycle to continue blocking the copper surface during deposition of silicon oxide to prevent oxidation of the copper surface and allow selective deposition of silicon oxide. In some embodiments, each cycle may involve repeating the same operations using the same chemistries and process conditions. In some embodiments, each cycle may involve repeating the operations using different chemistries. For example, a reducing agent used in one cycle may be different from a reducing agent used in another cycle.

Figure 5:
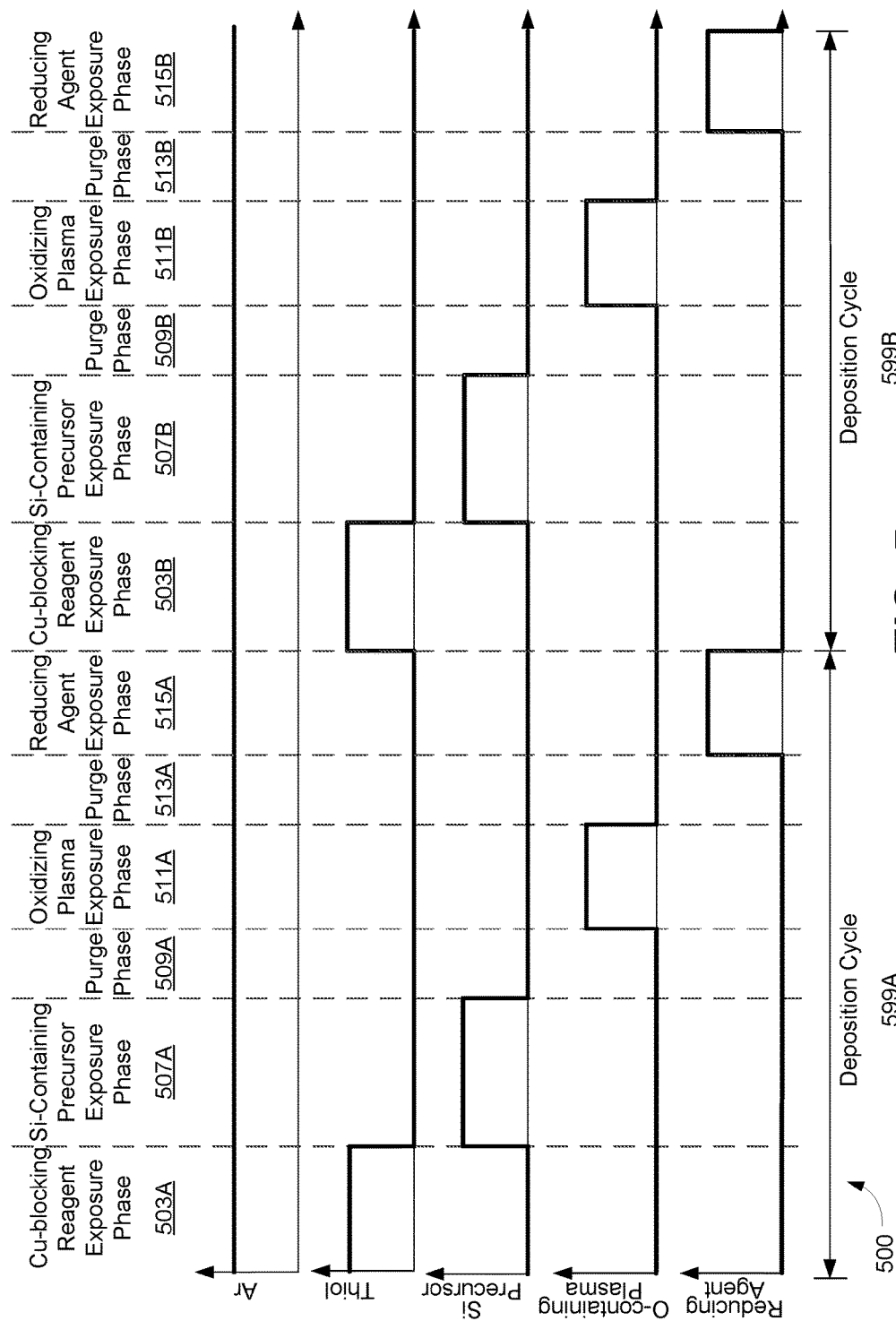
FIG. 5 is a timing sequence diagram showing an example of cycles in a method in accordance with certain disclosed embodiments.

FIG. 5 provides a timing schematic diagram of various operations performed in accordance with certain disclosed embodiments. Although process 500 depicted in FIG. 5 includes only two deposition cycles 599A and 599B, it will be understood that more than two depositions (and in some cases, only one deposition cycle) may be performed in certain disclosed embodiments.

FIG. 5 shows phases in an example deposition process 500, for various process parameters, such as flow of argon as a carrier gas and/or purge gas, thiol gas flow, silicon-containing precursor gas flow, oxygen-containing plasma exposure, and reducing agent gas flow. Although the example depicts oxygen-containing plasma as the deposition technique, in some embodiments an oxygen-containing gas may be used to deposit thermally. The lines indicate when the flow is turned on and off and when the plasma is turned on and off. Various disclosed embodiments depend on process parameters that include, but are not limited to, flow rates for inert and reactant species, flow rates for argon, thiol, silicon-containing precursor, and reducing agent gases, plasma conditions, substrate temperature, and process chamber pressure.

Deposition cycle 599A includes copper-blocking reagent exposure phase 503A, silicon-containing precursor exposure phase 507A, purge phase 509A, oxidizing plasma exposure phase 511A, purge phase 513A, and reducing agent exposure phase 515A. Copper-blocking reagent exposure phase 503A may correspond to operation 303 of FIG. 3. During copper-blocking reagent exposure phase 503A, argon flow may be on to bring in the copper-blocking reagent to the chamber, and thiol gas flow is on, while silicon-containing precursor gas flow, oxygen-containing plasma, and reducing agent gas flows are off. Although not specified in this example, it will be understood that the thiol may be any suitable thiol such as those described above with respect to operation 303 of FIG. 3. Following copper-blocking reagent exposure phase 503A, silicon-containing precursor exposure phase 507A is performed. Note that in this example, purge operation 305 of FIG. 3 is not performed but it will be understood that in various embodiments, operation 305 may be performed between the copper-blocking reagent exposure phase 503A and silicon-containing precursor exposure phase 507A. Silicon-containing precursor exposure phase 507A may correspond to operation 307 of FIG. 3. During silicon-containing precursor exposure phase 507A, argon flow may remain on to assist delivery of the silicon-containing precursor, while thiol gas flow is off, silicon-containing precursor flow is on, oxygen-containing plasma is off, and reducing agent gas flow is off. In purge phase 509A, all gas flows and plasmas are off except argon gas flow, which acts as a purge gas. Purge phase 509A may correspond to operation 309 of FIG. 3. In oxidizing plasma exposure phase 511A, argon flow may continue to be on, thiol gas flow is off, silicon-containing precursor gas flow is off, oxygen-containing plasma is on, and reducing agent gas flow is off. In various embodiments the oxygen-containing plasma is any weak oxidant ignited by plasma as described above with respect to operation 311 of FIG. 3. Oxidizing plasma exposure phase 511A may correspond to operation 311 of FIG. 3. In purge phase 513A, argon flow is on to act as a purge gas, while thiol gas flow is off, silicon-containing precursor gas flow is off, oxygen-containing plasma is off, and reducing agent gas flow is off. Purge phase 513A may correspond to operation 313 of FIG. 3. In reducing agent exposure phase 515A, argon flow may act as a carrier gas to assist in delivery of the reducing agent, thiol gas flow is off, silicon-containing precursor gas flow is off, oxygen-containing plasma is off, and reducing agent gas flow is on. Although the example depicted here involves a thermal reaction for the reducing agent exposure, it will be understood that in some embodiments, the reducing agent gas flow is on while a plasma is ignited during this exposure phase. Reducing agent exposure phase 515A may correspond to operation 315 of FIG. 3. In this example, a purge operation is not performed after reducing agent exposure phase 515A but it will be understood that in some embodiments, a purge operation may be performed. In this example, it is determined that silicon oxide is not deposited to the desired thickness, so the operations are repeated in deposition cycle 599B. Deposition cycle 599B including copper-blocking reagent exposure phase 503B, whereby argon flow and thiol flow are on while silicon-containing gas flow, oxygen-containing plasma, and reducing agent gas flows are off; silicon-containing precursor exposure phase 507B, where only argon and silicon-containing gas flows are on while thiol gas flow, oxygen-containing plasma, and reducing agent gas flow are off; purge phase 509B whereby only argon is flowed as a purge gas; oxidizing plasma exposure phase 511B whereby only argon and oxygen-containing plasma are on while thiol, silicon-containing precursor gas, and reducing agent gas flows are off; purge phase 513B whereby argon is flowed as a purge gas; and reducing agent exposure phase 515B whereby only argon and the reducing agent gas flows are on while the silicon-containing precursor gas, thiol gas, and oxygen-containing plasma are off.

In various embodiments, after the silicon oxide is deposited to a sufficient thickness, the copper surface may be reduced by a reducing agent, and any remaining thiols on the copper surface may be removed by an acetic acid rinse.

Apparatus

Figure 6:
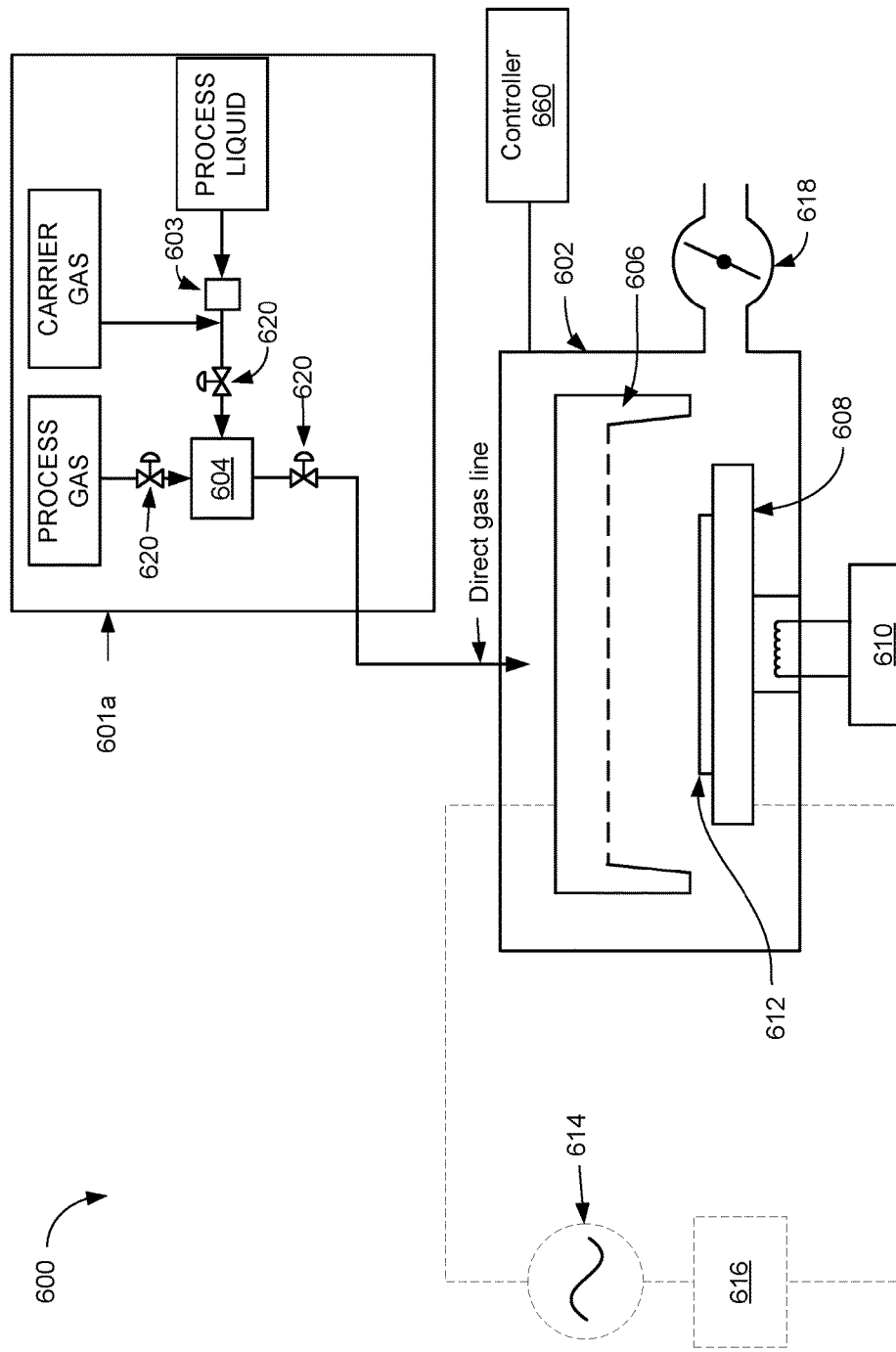
FIG. 6 is a schematic diagram of an example process chamber for performing disclosed embodiments.
Figure 7:
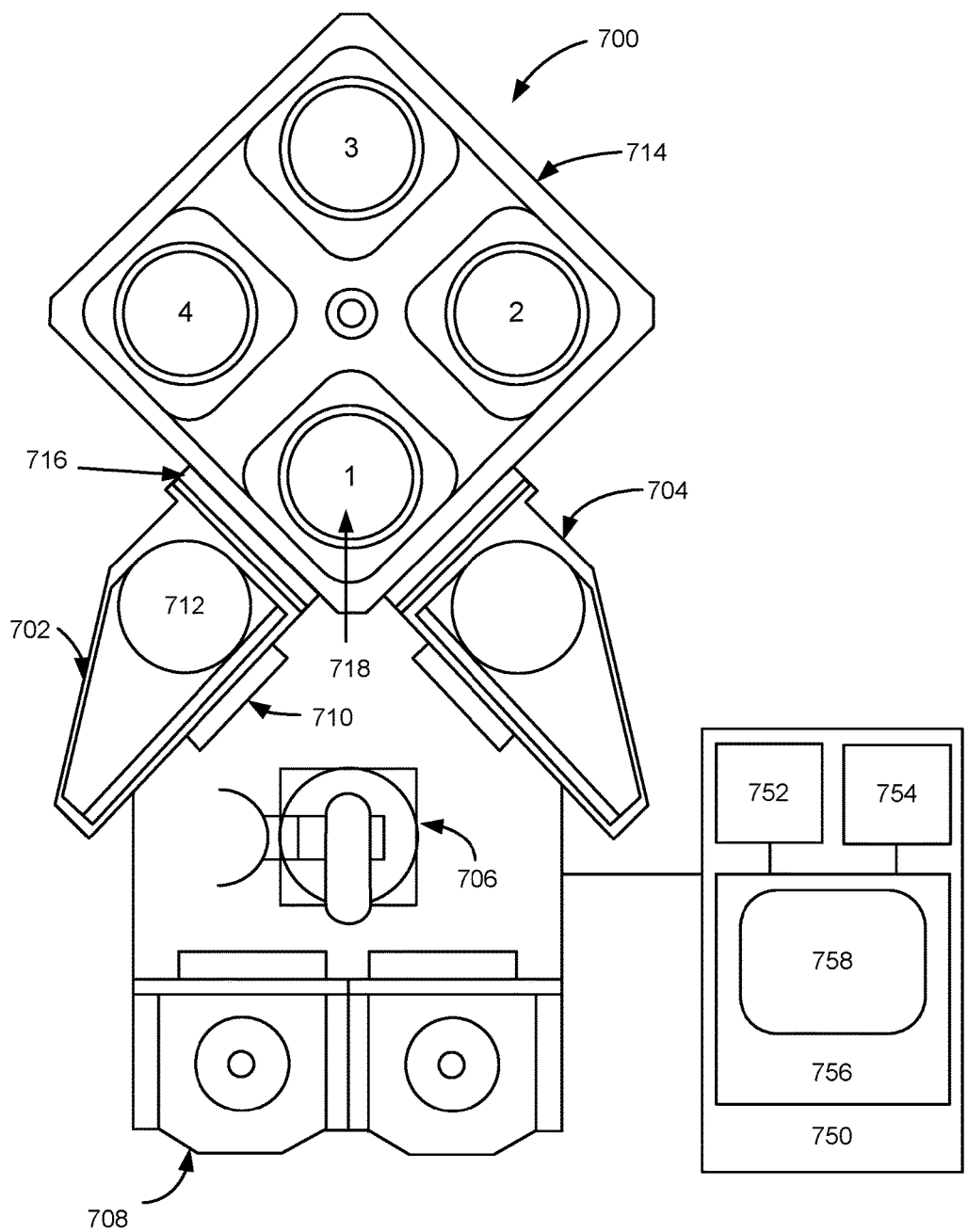
FIG. 7 is a schematic diagram of an example process tool for performing disclosed embodiments.

FIG. 6 depicts a schematic illustration of an embodiment of an atomic layer deposition (ALD) process station 600 having a process chamber body 602 for maintaining a low-pressure environment. A plurality of ALD process stations 600 may be included in a common low pressure process tool environment. For example, FIG. 7 depicts an embodiment of a multi-station processing tool 700. In some embodiments, one or more hardware parameters of ALD process station 600 including those discussed in detail below may be adjusted programmatically by one or more computer controllers 650.

ALD process station 600 fluidly communicates with reactant delivery system 601a for delivering process gases to a distribution showerhead 606. Reactant delivery system 601a includes a mixing vessel 604 for blending and/or conditioning process gases, such as an aminosilane precursor gas, or mild oxidant gas (e.g., carbon dioxide), or reducing agent (e.g., hydrogen) gas, for delivery to showerhead 606. One or more mixing vessel inlet valves 620 may control introduction of process gases to mixing vessel 604. Mild oxidizing plasma and/or reducing agent plasma may also be delivered to the showerhead 606 or may be generated in the ALD process station 600.

As an example, the embodiment of FIG. 6 includes a vaporization point 603 for vaporizing liquid reactant to be supplied to the mixing vessel 604. In some embodiments, vaporization point 603 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 603 may be heat traced. In some examples, mixing vessel 604 may also be heat traced. In one non-limiting example, piping downstream of vaporization point 603 has an increasing temperature profile extending from approximately 100° C. to approximately 150° C. at mixing vessel 604.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 603. In one scenario, a liquid injector may be mounted directly to mixing vessel 604. In another scenario, a liquid injector may be mounted directly to showerhead 606.

In some embodiments, a liquid flow controller (LFC) upstream of vaporization point 603 may be provided for controlling a mass flow of liquid for vaporization and delivery to process station 600. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 606 distributes process gases toward substrate 612. In the embodiment shown in FIG. 6, the substrate 612 is located beneath showerhead 606 and is shown resting on a pedestal 608. Showerhead 606 may have any suitable shape, and may have any suitable number and arrangement of ports for distributing process gases to substrate 612.

In some embodiments, pedestal 608 may be raised or lowered to expose substrate 612 to a volume between the substrate 612 and the showerhead 606. It will be appreciated that, in some embodiments, pedestal height may be adjusted programmatically by a suitable computer controller 650.

In another scenario, adjusting a height of pedestal 608 may allow a plasma density to be varied during plasma activation cycles in the process in embodiments where a plasma is ignited. At the conclusion of the process phase, pedestal 608 may be lowered during another substrate transfer phase to allow removal of substrate 612 from pedestal 608.

In some embodiments, pedestal 608 may be temperature controlled via heater 610. In some embodiments, the pedestal 608 may be heated to a temperature of between about 70° C. and about 200° C., or between about 100° C. and about 120° C.

Further, in some embodiments, pressure control for process station 600 may be provided by butterfly valve 618. As shown in the embodiment of FIG. 6, butterfly valve 618 throttles a vacuum provided by a downstream vacuum pump (not shown). However, in some embodiments, pressure control of process station 600 may also be adjusted by varying a flow rate of one or more gases introduced to the process station 600.

In some embodiments, a position of showerhead 606 may be adjusted relative to pedestal 608 to vary a volume between the substrate 612 and the showerhead 606. Further, it will be appreciated that a vertical position of pedestal 608 and/or showerhead 606 may be varied by any suitable mechanism within the scope of the present disclosure. In some embodiments, pedestal 608 may include a rotational axis for rotating an orientation of substrate 612. It will be appreciated that, in some embodiments, one or more of these example adjustments may be performed programmatically by one or more suitable computer controllers 650.

In some embodiments where plasma may be used as discussed above, showerhead 606 and pedestal 608 electrically communicate with a radio frequency (RF) power supply 614 and matching network 616 for powering a plasma. In some embodiments, the plasma energy may be controlled by controlling one or more of a process station pressure, a gas concentration, an RF source power, an RF source frequency, and a plasma power pulse timing. For example, RF power supply 614 and matching network 616 may be operated at any suitable power to form a plasma having a desired composition of radical species. Examples of suitable powers are about 150 W to about 6000 W. Plasma may be used during treatment of a silicon nitride surface prior to selective deposition of silicon oxide on silicon oxide relative to silicon nitride. RF power supply 614 may provide RF power of any suitable frequency. In some embodiments, RF power supply 614 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 650 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an copper- or metal-blocking reagent gas, instructions for setting a flow rate of a carrier gas (such as argon), instructions for igniting a plasma, and time delay instructions for the first recipe phase. A second recipe phase may include instructions for setting a flow rate of an inert and/or aminosilane silicon precursor gas, instructions for setting a flow rate of a carrier gas (such as argon), and time delay instructions for a second recipe phase. A third, subsequent recipe phase may include instructions for modulating or stopping a flow rate of an inert and/or a reactant gas, and instructions for modulating a flow rate of a carrier or purge gas and time delay instructions for the third recipe phase. A fourth recipe phase may include instructions for modulating a flow rate of a weak oxidant gas, instructions for igniting a plasma, instructions for modulating the flow rate of a carrier or purge gas, and time delay instructions for the fourth recipe phase. A fifth, subsequent recipe phase may include instructions for modulating or stopping a flow rate of an inert and/or a reactant gas, and instructions for modulating a flow rate of a carrier or purge gas and time delay instructions for the fifth recipe phase. A sixth recipe phase may include instructions for modulating a flow rate of a reducing agent gas, instructions for igniting a plasma, instructions for modulating the flow rate of a carrier gas, and time delay instructions for the sixth recipe phase. It will be appreciated that these recipe phases may be further subdivided and/or iterated in any suitable way within the scope of the disclosed embodiments. In some embodiments, the controller 650 may include any of the features described below with respect to system controller 750 of FIG. 7.

As described above, one or more process stations may be included in a multi-station processing tool. FIG. 7 shows a schematic view of an embodiment of a multi-station processing tool 700 with an inbound load lock 702 and an outbound load lock 704, either or both of which may include a remote plasma source. A robot 706 at atmospheric pressure is configured to move wafers from a cassette loaded through a pod 708 into inbound load lock 702 via an atmospheric port 710. A wafer is placed by the robot 706 on a pedestal 712 in the inbound load lock 702, the atmospheric port 710 is closed, and the load lock is pumped down. Further, the wafer also may be heated in the inbound load lock 702 as well, for example, to remove moisture and adsorbed gases.

Next, a chamber transport port 716 to processing chamber 714 is opened, and another robot (not shown) places the wafer into the reactor on a pedestal of a first station shown in the reactor for processing. While the embodiment depicted in FIG. 7 includes load locks, it will be appreciated that, in some embodiments, direct entry of a wafer into a process station may be provided.

The depicted processing chamber 714 includes four process stations, numbered from 1 to 4 in the embodiment shown in FIG. 7. Each station has a heated pedestal (shown at 718 for station 1), and gas line inlets. It will be appreciated that in some embodiments, each process station may have different or multiple purposes. For example, in some embodiments, a process station may be switchable between an ALD and plasma-enhanced ALD process mode. Additionally or alternatively, in some embodiments, processing chamber 714 may include one or more matched pairs of ALD and plasma-enhanced ALD process stations. While the depicted processing chamber 714 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 7 depicts an embodiment of a wafer handling system 790 for transferring wafers within processing chamber 714. In some embodiments, wafer handling system 790 may transfer wafers between various process stations and/or between a process station and a load lock. It will be appreciated that any suitable wafer handling system may be employed. Non-limiting examples include wafer carousels and wafer handling robots. FIG. 7 also depicts an embodiment of a system controller 750 employed to control process conditions and hardware states of process tool 700. System controller 750 may include one or more memory devices 756, one or more mass storage devices 754, and one or more processors 752. Processor 752 may include a CPU or computer, analog, and/or digital input/output connections, stepper motor controller boards, etc.

In some embodiments, system controller 750 controls all of the activities of process tool 700. System controller 750 executes system control software 758 stored in mass storage device 754, loaded into memory device 756, and executed on processor 752. Alternatively, the control logic may be hard coded in the controller 750. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 758 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 700. System control software 758 may be configured in any suitable way. For example, various process tool component subroutines or control objects may be written to control operation of the process tool components used to carry out various process tool processes. System control software 758 may be coded in any suitable computer readable programming language.

In some embodiments, system control software 758 may include input/output control (IOC) sequencing instructions for controlling the various parameters described above.

Other computer software and/or programs stored on mass storage device 754 and/or memory device 756 associated with system controller 750 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 718 and to control the spacing between the substrate and other parts of process tool 700.

A process gas control program may include code for controlling gas composition (e.g., copper or metal-blocking reagent gases such as ethane thiol and butane thiol, aminosilane gases, and weak oxidant gases, reducing agent gases, carrier gases and/or purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 750. The user interface may include a display screen, graphical software displays of the apparatus and/or process conditions, and user input devices such as pointing devices, keyboards, touch screens, microphones, etc.

In some embodiments, parameters adjusted by system controller 750 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 750 from various process tool sensors. The signals for controlling the process may be output on the analog and digital output connections of process tool 700. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 750 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 750 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 750.

In some implementations, the system controller 750 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 750, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 750 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 750 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 750, in some implementations, may be a part of or coupled to a computer that is integrated with, coupled to the system, otherwise networked to the system, or a combination thereof. For example, the system controller 750 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 750 receives instructions in the form of data, which specify parameters for each of the processing steps to be performed during one or more operations. It should be understood that the parameters may be specific to the type of process to be performed and the type of tool that the system controller 750 is configured to interface with or control. Thus as described above, the system controller 750 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 750 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Experimental
Experiment 1

Figure 8A:
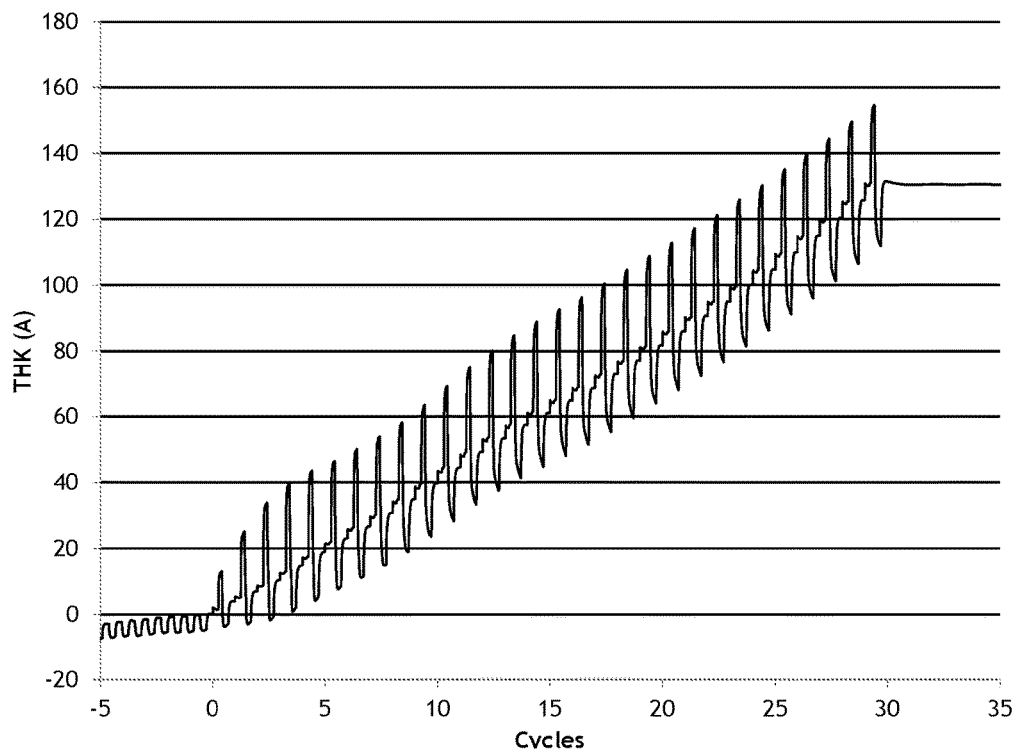
FIGS. 8A, 8B, 9A, 9B, 9C, and 9D show experimental results for thickness of film deposited on silicon oxide and copper surfaces.
Figure 8B:
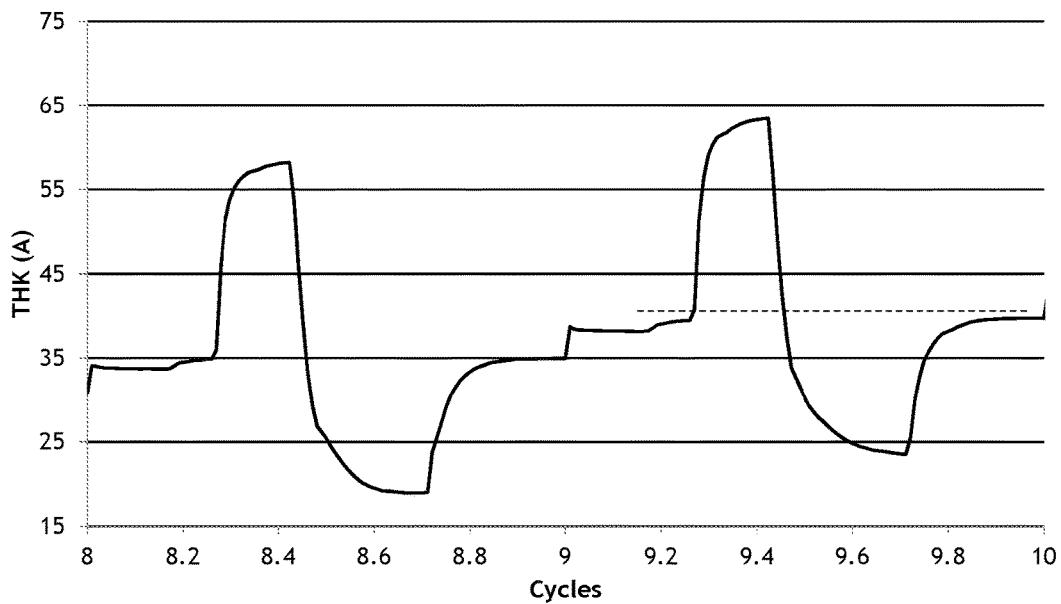

An experiment was conducted on a surface of silicon oxide and separately on a surface of copper to evaluate growth of silicon oxide using SAM24 on the two surfaces using cycling of silicon oxide deposition and reducing agent exposure. The silicon oxide surface was exposed to 35 cycles of the following cycle: 1 second dose of SAM24, 16 seconds of purge using argon gas, 10 seconds of weak oxidant $CO_2$ and argon flow, 1 second pulse of $CO_2$ and argon using 50 W plasma, 16 seconds of purge using argon, 30 seconds of reducing agent hydrogen plasma and argon generated using a 50 W plasma, and 30 seconds of purge using argon. The experiment exhibited a steady growth rate of 1.4 Å of silicon oxide per cycle. The results indicated that the hydrogen/argon plasma did not affect silicon oxide deposition, as a prior experiment was conducted involving 25 cycles of the deposition cycle of 1 second dose of SAM24, 16 seconds of purge using argon gas, 10 seconds of weak oxidant $CO_2$ and argon flow, 1 second pulse of $CO_2$ and argon using 50 W plasma, and 16 seconds of purge using argon, which exhibited the same growth rate of 1.4 Å/cycle. The copper surface was exposed to argon/hydrogen plasma reduction 30 followed by 30 cycles of the following deposition cycle: 1 second dose of SAM24, 16 seconds of purge using argon gas, 10 seconds of weak oxidant $CO_2$ and argon flow, 1 second pulse of $CO_2$ and argon using 50 W plasma, 16 seconds of purge using argon, 30 seconds of reducing agent hydrogen plasma and argon generated using a 50 W plasma, and 30 seconds of purge using argon. The growth rate exhibited on the copper surface was 4.3 Å/cycle. The resulting graph depicted in FIGS. 8A and 8B (8A showing the overall cycles, and 8B showing a zoomed in section of two cycles in particular) showed that the hydrogen plasma reduced the copper oxide, but not sufficiently enough. The higher growth rate exhibited may be due to different adsorption/nucleation behavior on copper versus on silicon oxide.

Experiment 2

An experiment was conducted on a surface of silicon oxide and separately on a surface of copper to evaluate growth of silicon oxide using SAM24 on the two surfaces using cycling of thiol exposure, silicon oxide deposition, and reducing agent exposure.

Both the silicon oxide surface and the copper surface were exposed to argon/hydrogen plasma pre-treatment, followed by 100 cycles of the following deposition cycle:
(1) 2 second dose of butane thiol
(2) 10 seconds of purge using argon gas
(3) 1 second dose of SAM24
(4) 16 seconds of purge using argon gas
(5) 10 seconds of weak oxidant $CO_2$ and argon flow
(6) 1 second pulse of $CO_2$ and argon using 50 W plasma
(7) 16 seconds of purge using argon
(8) 30 seconds of reducing agent hydrogen plasma and argon generated using a 50 W plasma
(9) 30 seconds of purge using argon.

Figure 9A:
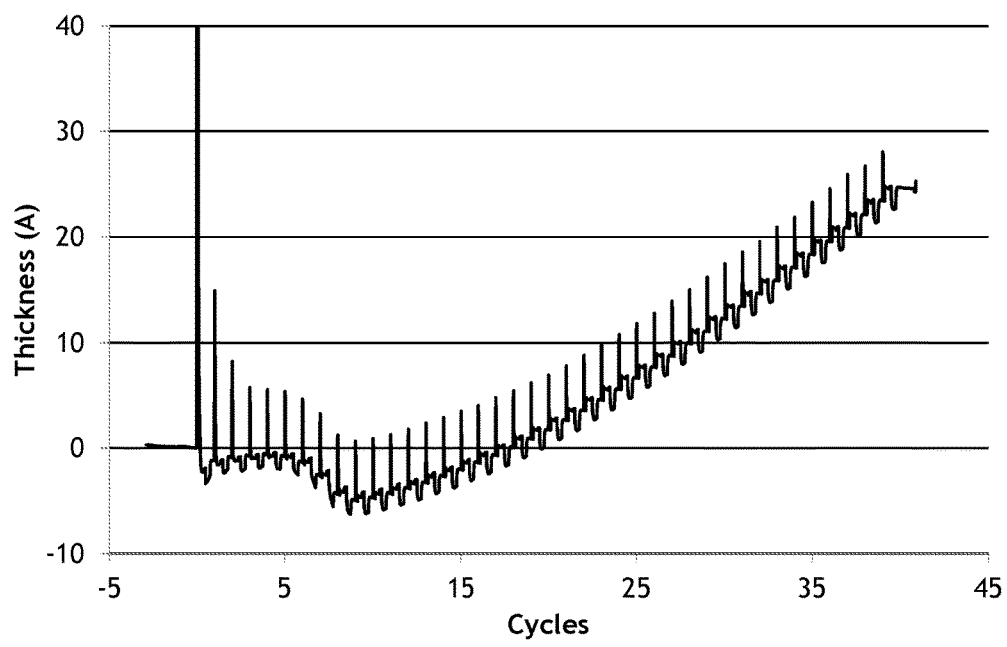
Figure 9B:
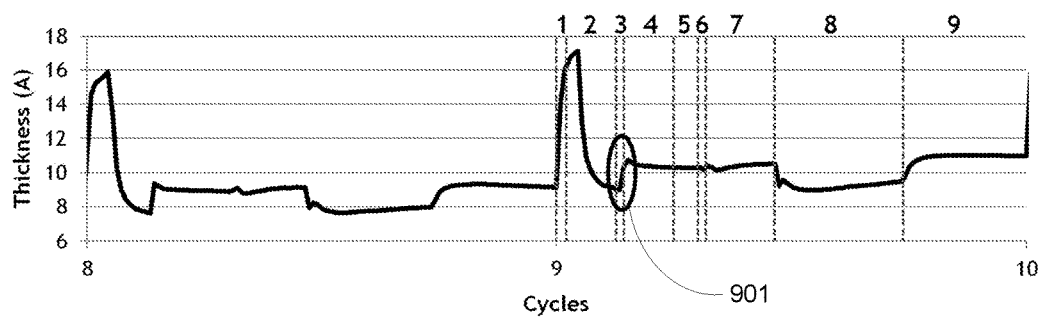
Figure 9C:
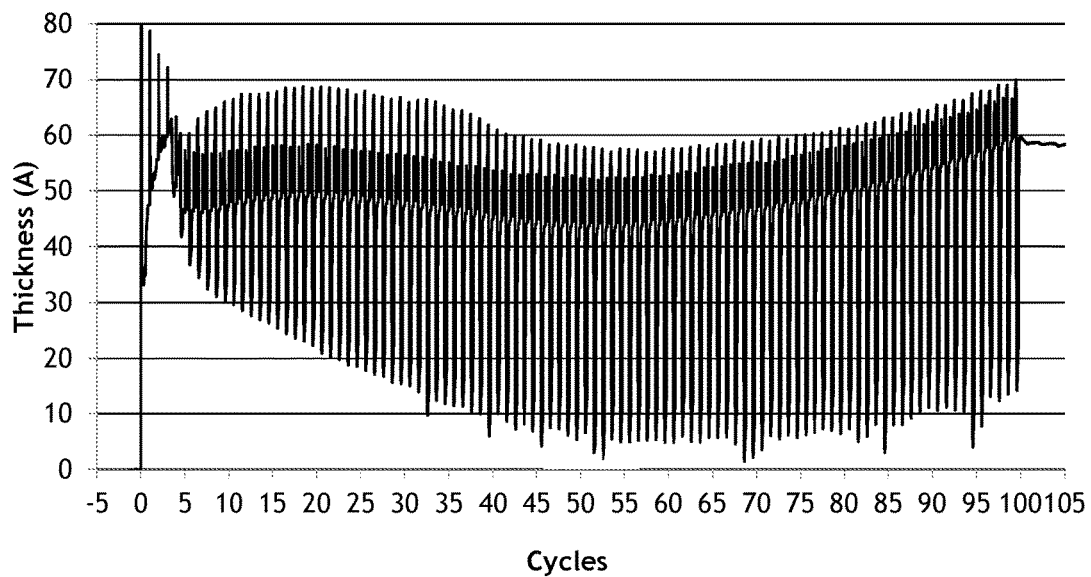
Figure 9D:
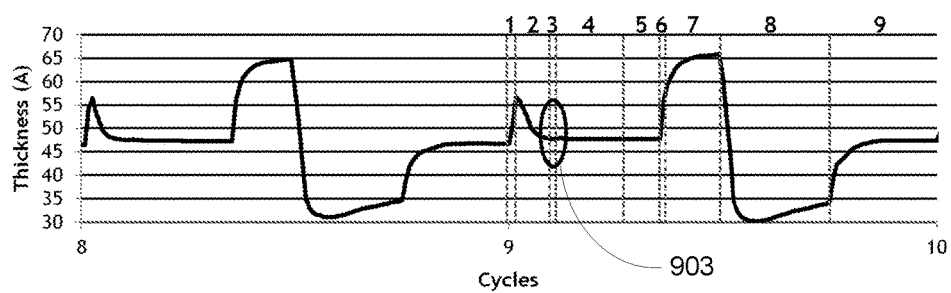

FIGS. 9A and 9B show the thickness on oxide for the overall cycles and for one single cycle, respectively, the reference labels in the cycle corresponding to the labeled number in the above deposition cycle. FIGS. 9C and 9D show the thickness on the copper surface for the overall cycles and two cycles respectively, the reference labels in the cycle corresponding to the labeled number in the above deposition cycle.

The experiment showed some loading effect on the silicon oxide surface in initial cycles, but then continued linear and steady growth rate of silicon oxide. In FIG. 9B, 901 shows the effect of SAM24 adsorbing onto the substrate surface in the deposition cycle. The thickness measured also showed clear inhibition of SAM-24 adsorption on copper during the 1 second dose of SAM-24 indicated in the circled portion 903 of FIG. 9D. The results also showed stagnant growth on copper after the initial thiol loading.

Table 1 below summarizes the thickness of silicon oxide measured on the silicon oxide and copper surfaces, the silicon oxide actually deposited on each surface, and the relative selectivity.

TABLE 1

Silicon Oxide Growth on Silicon Oxide and Copper Surfaces

| Substrate | $SiO_2$ Thickness (Å) | $SiO_2$ Thickness minus native oxide (Å) | Relative Selectivity |
|---|---|---|---|
| Si | 38 | 28 | 5.6 |
| Cu | 5 | 5 | 1 |

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of selectively depositing silicon oxide on a dielectric material relative to copper on a substrate, the method comprising:
   (a) providing the substrate comprising the dielectric material and exposed copper metal surface;
   (b) prior to depositing the silicon oxide, exposing the substrate to a copper-blocking reagent to selectively adsorb onto the exposed copper metal surface;
   (c) exposing the substrate to a silicon-containing precursor to adsorb the silicon-containing precursor onto the dielectric material;
   (d) exposing the substrate to an oxidizing plasma generated in an environment comprising a weak oxidant to convert the adsorbed silicon-containing precursors to silicon oxide; and
   (e) exposing the substrate to a reducing agent to reduce the exposed copper metal surface.

2. The method of claim 1, wherein the copper-blocking reagent comprises sulfur.

3. The method of claim 1, wherein the copper-blocking reagent is an alkyl thiol.

4. The method of claim 3, wherein the copper-blocking reagent is selected from the group consisting of ethane thiol and butane thiol.

5. The method of claim 1, wherein the copper-blocking reagent is an alkyl thiol having a chemical formula $SH(CH_2)_nCH_3$ whereby n is an integer between and including 2 and 12.

6. The method of claim 1, wherein the silicon-containing precursor is an aminosilane.

7. The method of claim 1, wherein the silicon-containing precursor is selected from the group consisting of N-(diethylaminosilyl)-N-ethylethanamine, bis(diethylamino)silane (BDEAS), diisopropylamino silane (DiPAS), diisobutylamino silane (DiBAS), bis(tert-butylamino)silane (BTBAS), and tris(dimethylamino)silane (TDMAS).

8. The method of claim 1, wherein the weak oxidant is selected from the group consisting of carbon dioxide, nitrous oxide, ozone, plasmas thereof, and water.

9. The method of claim 1, wherein the reducing agent is selected from the group consisting of hydrogen gas, hydrogen plasma, hydrazine gas, hydrazine plasma, ammonia gas, ammonia plasma, alcohols, and aldehydes.

10. The method of claim 1, wherein silicon oxide is deposited at a temperature between about 70° C. and about 200° C.

11. The method of claim 1, further comprising, prior to exposing the substrate to the copper-blocking reagent, introducing a second reducing agent to reduce the exposed copper metal surface.

12. The method of claim 11, wherein the second reducing agent is selected from the group consisting of hydrogen gas, hydrogen plasma, hydrazine gas, hydrazine plasma, ammonia gas, ammonia plasma, alcohols, and aldehydes.

13. The method of claim 1, wherein the dielectric material is selected from the group consisting of silicon dioxide, aluminum oxide, silicon oxycarbides, silicon carbonitrides, and silicon oxycarbonitrides.

14. The method of claim 1, further comprising repeating operations (b)-(e) in two or more cycles.

15. The method of claim 1, wherein (c) is self-limiting.

16. The method of claim 1, wherein the copper-blocking reagent preferentially adsorbs to the exposed copper metal surface to block subsequent deposition of the silicon oxide on the exposed copper metal surface.

17. A method of selectively depositing silicon oxide on a dielectric material relative to a metal-containing surface on a substrate, the method comprising:
   (a) providing the substrate comprising the dielectric material and exposed metal-containing surface;
   (b) prior to depositing the silicon oxide, exposing the substrate to a metal-blocking reagent to selectively adsorb onto the exposed metal-containing surface;
   (c) exposing the substrate to a silicon-containing precursor to adsorb the silicon-containing precursor onto the dielectric material;
   (d) exposing the substrate to an oxidizing plasma generated in an environment comprising a weak oxidant to convert the adsorbed silicon-containing precursors to silicon oxide; and
   (e) exposing the substrate to a reducing agent to reduce the exposed metal-containing surface.

18. The method of claim 17, wherein the exposed metal-containing surface comprises copper.

19. The method of claim 17, wherein the exposed metal-containing surface comprises ruthenium.

20. The method of claim 17, wherein the exposed metal-containing surface comprises a material selected from the group consisting of copper metal, copper oxide, ruthenium metal, and ruthenium oxide.

* * * * *